(12) United States Patent
Park et al.

(10) Patent No.: US 12,727,499 B2
(45) Date of Patent: Sep. 1, 2026

(54) THREE-DIMENSIONAL SEMICONDUCTOR PACKAGE WITH PACKAGE-ON-PACKAGE SEMICONDUCTOR CHIPS

(71) Applicant: SAMSUNG ELECTRONICS CO., LTD., Suwon-si (KR)

(72) Inventors: Hwanjoo Park, Suwon-si (KR); Sunggu Kang, Suwon-si (KR); Jaechoon Kim, Suwon-si (KR); Taehwan Kim, Suwon-si (KR); Sungho Mun, Suwon-si (KR); Jonggyu Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 300 days.

(21) Appl. No.: 18/229,039

(22) Filed: Aug. 1, 2023

(65) Prior Publication Data

US 2024/0055339 A1 Feb. 15, 2024

(30) Foreign Application Priority Data

Aug. 9, 2022 (KR) ........................ 10-2022-0099509

(51) Int. Cl.
*H10W 70/685* (2026.01)
*H10W 40/22* (2026.01)
(Continued)

(52) U.S. Cl.
CPC ......... *H10W 70/685* (2026.01); *H10W 40/22* (2026.01); *H10W 90/00* (2026.01); (Continued)

(58) Field of Classification Search
None
See application file for complete search history.

(56) References Cited

U.S. PATENT DOCUMENTS 9,576,938 B2 2/2017 Hung et al.
10,109,616 B2 10/2018 Karhade
(Continued)

FOREIGN PATENT DOCUMENTS

JP 7044653 B2 3/2022
KR 10-2021-0069166 A 6/2021
KR 10-2021-0073956 A 6/2021

OTHER PUBLICATIONS

Communication dated Feb. 16, 2026, issued by the Korean Ministry of Intellectual Property in Korean Application No. 10-2022-0099509.

*Primary Examiner* — Nilufa Rahim
(74) *Attorney, Agent, or Firm* — Sughrue Mion, PLLC

(57) ABSTRACT

A semiconductor package includes a first redistribution structure, a first semiconductor package on the first redistribution structure, the first semiconductor package including a first semiconductor chip which includes a first device layer and a first semiconductor substrate including a through electrode, a second semiconductor chip which is on the first semiconductor chip and includes a second device layer and a second semiconductor substrate, and a molding member surrounding the first semiconductor chip, a second redistribution structure on an upper surface of the molding member, and a second semiconductor package on the second redistribution structure, the second semiconductor package including a third semiconductor chip, wherein the second semiconductor chip is apart from the second semiconductor package in a horizontal direction, and an upper surface of the second semiconductor chip is higher than the upper surface of the molding member.

18 Claims, 19 Drawing Sheets

(51) Int. Cl.
*H10W 90/00* (2026.01)
*H10W 74/00* (2026.01)
*H10W 90/20* (2026.01)

(52) U.S. Cl.
CPC .......... *H10W 90/701* (2026.01); *H10W 74/00* (2026.01); *H10W 90/288* (2026.01); *H10W 90/722* (2026.01); *H10W 90/724* (2026.01); *H10W 90/732* (2026.01); *H10W 90/734* (2026.01)

(56) References Cited

U.S. PATENT DOCUMENTS 10,741,525 B2 8/2020 Takishita et al.
11,069,657 B2 7/2021 Wei et al.
2018/0331080 A1 11/2018 Geissler et al.
2020/0035591 A1* 1/2020 Hu .................... H01L 23/49838
2021/0257277 A1 8/2021 Bertrand et al.
2022/0077113 A1 3/2022 Ong et al.
2022/0108932 A1* 4/2022 Liu ..................... H01L 25/0652
2022/0415805 A1* 12/2022 Waidhas ............. H01L 23/3675
2023/0040030 A1* 2/2023 Chen ................... H01L 25/0657
2023/0139378 A1* 5/2023 Lee ..................... H01L 25/0652 257/690
2023/0144206 A1* 5/2023 Dogiamis .............. H01Q 1/526 257/774
2023/0170327 A1* 6/2023 Yang ..................... H01L 25/105 257/737
2023/0187407 A1* 6/2023 Molnar ................... H01L 25/50 257/777
2023/0230902 A1* 7/2023 Lu ........................... H01L 25/18 257/690
2023/0282614 A1* 9/2023 Hsieh ...................... H01L 25/50 257/700
2024/0006294 A1* 1/2024 Ono ........................ H01L 24/16
2024/0038613 A1* 2/2024 Zhao ................... H01L 23/3135
2025/0323135 A1* 10/2025 Jo ....................... H01L 23/5386

* cited by examiner 100
310
330
334
331
332
333
316
314
315
311
312
313
124
350
351
300
370
371
372
X
Y
Z

THREE-DIMENSIONAL SEMICONDUCTOR PACKAGE WITH PACKAGE-ON-PACKAGE SEMICONDUCTOR CHIPS

CROSS-REFERENCE TO RELATED APPLICATION

This application is based on and claims priority under 35 U.S.C. § 119 to Korean Patent Application No. 10-2022-0099509, filed on Aug. 9, 2022, in the Korean Intellectual Property Office, the disclosure of which is incorporated by reference herein in its entirety.

BACKGROUND

The disclosure relates to a semiconductor package, and more particularly, to a three-dimensional (3D) integrated circuit (IC) package on package (PoP) having improved thermal characteristics.

Recently, in electronic products market, the demand for portable devices has been rapidly increasing, and thus, it is continuously required to miniaturize and lighten electronic parts equipped in electronic products. To miniaturize and lighten electronic parts, the volume of semiconductor packages equipped therein needs to be progressively reduced and to process massive amounts of data. As semiconductor packages are miniaturized and made lighter, the dissipation of heat occurring in semiconductor packages is becoming an issue.

SUMMARY

The disclosure provides a semiconductor package having improved thermal characteristics.

The object of the disclosure is not limited to the aforesaid, but other objects not described herein will be clearly understood by those of ordinary skill in the art from descriptions below.

The disclosure provides the following semiconductor package.

In accordance with an aspect of the disclosure, a semiconductor package includes a first redistribution structure; a first semiconductor package on the first redistribution structure, the first semiconductor package including a first semiconductor chip which includes a first device layer and a first semiconductor substrate including a through electrode, a second semiconductor chip which is on the first semiconductor chip and includes a second device layer and a second semiconductor substrate, and a molding member surrounding the first semiconductor chip; a second redistribution structure on an upper surface of the molding member; and a second semiconductor package on the second redistribution structure, the second semiconductor package including a third semiconductor chip, wherein the second semiconductor chip is apart from the second semiconductor package in a horizontal direction, and wherein an upper surface of the second semiconductor chip is higher than the upper surface of the molding member.

In accordance with an aspect of the disclosure, a semiconductor package includes a first redistribution structure; a first semiconductor package including a first semiconductor chip which is on the first redistribution structure and includes a first semiconductor substrate, a through electrode passing through the first semiconductor substrate, and a first device layer on the first semiconductor substrate, a second semiconductor chip which is on the first semiconductor chip and includes a second semiconductor substrate and a second device layer on the second semiconductor substrate, and a molding member surrounding the first semiconductor chip and the second semiconductor chip; a first dummy chip on an upper surface of the second semiconductor chip; a second redistribution structure on an upper surface of the molding member and apart from the first dummy chip in a horizontal direction; and a second semiconductor package on the second redistribution structure, the second semiconductor package including a third semiconductor chip, wherein the first dummy chip is apart from the second semiconductor package in the horizontal direction, and wherein an upper surface of the first dummy chip is higher than the upper surface of the molding member.

In accordance with an aspect of the disclosure, a semiconductor package includes a first redistribution structure including a first insulation layer and a first redistribution pattern in the first insulation layer; a first semiconductor package including a first semiconductor chip which is on the first redistribution structure and includes a first device layer and a first semiconductor substrate including a through electrode, a second semiconductor chip which is on the first semiconductor chip and includes a second semiconductor substrate and a second device layer, an adhesive layer between the first semiconductor chip and the second semiconductor chip, a molding member surrounding the first semiconductor chip and the second semiconductor chip, and a conductive pillar passing through the molding member; a first dummy chip on an upper surface of the second semiconductor chip; a die attach film between the second semiconductor chip and the first dummy chip to attach the first dummy chip on the second semiconductor chip; a second redistribution structure on an upper surface of the molding member and apart from the first dummy chip in a horizontal direction; and a second semiconductor package on the second redistribution structure, the second semiconductor package including a third semiconductor chip, wherein the second device layer is on the second semiconductor substrate, wherein the first dummy chip is apart from the second semiconductor package in the horizontal direction, wherein a vertical distance to an upper surface of the first dummy chip from a lower surface of the first redistribution structure is in a range of 1 mm to 1.3 mm, and wherein the upper surface of the first dummy chip and an upper surface of the second semiconductor package are on the same plane.

BRIEF DESCRIPTION OF THE DRAWINGS

Embodiments will be more clearly understood from the following detailed description taken in conjunction with the accompanying drawings in which:

FIGS. 2A and 2B are enlarged views for describing a region AA in the semiconductor package of FIG. 1;

FIG. 7 is a cross-sectional view illustrating a semiconductor package according to an embodiment;

DETAILED DESCRIPTION OF EMBODIMENTS

Figure 1:
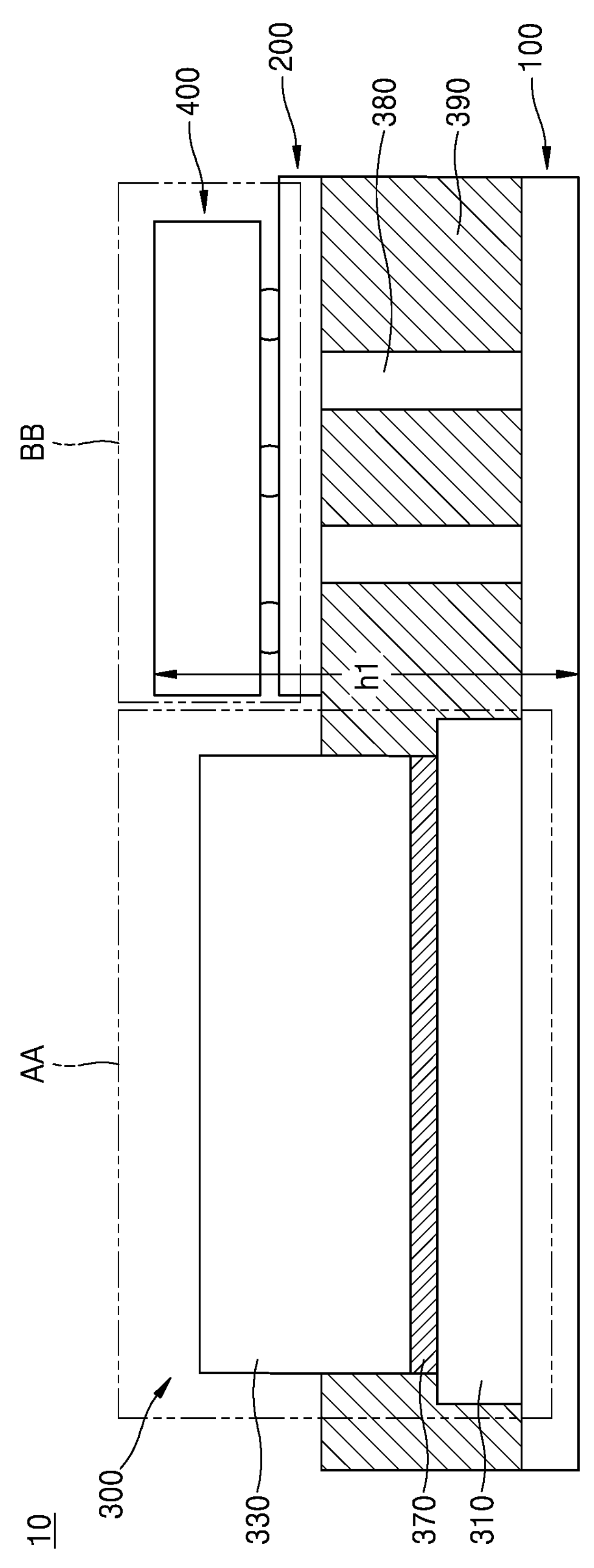
FIG. 1 is a schematic diagram illustrating a semiconductor package according to an embodiment.
Figure 1:
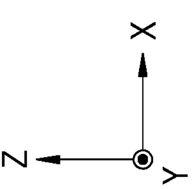

Hereinafter, various embodiments will be described in detail with reference to the accompanying drawings. Like reference numerals refer to like elements in the drawings, and their repeated descriptions are omitted.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present. Like numerals refer to like elements throughout.

Spatially relative terms, such as "over," "above," "on," "upper," "below," "under," "beneath," "lower," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

For the sake of brevity, conventional elements to semiconductor devices may or may not be described in detail herein for brevity purposes.

FIG. 1 is a schematic diagram illustrating a semiconductor package 10 according to an embodiment.

Referring to FIG. 1, a semiconductor package 10 according to an embodiment may include a first redistribution structure 100, a first semiconductor package 300, a second redistribution structure 200, and a second semiconductor package 400.

The first redistribution structure 100 may include layers which are mutually stacked in a vertical direction Z. The first redistribution structure 100 may include an upper surface and a lower surface, which are opposite to each other, and one of the upper surface and the lower surface thereof may be a planar surface.

In the following drawings, an X-axis direction and a Y-axis direction may each represent a direction parallel to at least one of an upper surface or a lower surface of the first redistribution structure 100, and the X-axis direction and the Y-axis direction may be directions perpendicular to each other. The Z-axis direction may represent a direction vertical to the at least one of the upper surface or the lower surface of the first redistribution structure 100. In other words, the Z-axis direction may be a direction perpendicular to an X-Y plane.

Also, in the following drawings, a first horizontal direction, a second horizontal direction, and a vertical direction may be understood as follows. The first horizontal direction may be understood as the X-axis direction, the second horizontal direction may be understood as the Y-axis direction, and the vertical direction may be understood as the Z-axis direction.

The first redistribution structure 100 may be a package substrate with the first semiconductor package 300 mounted thereon. In embodiments, the first redistribution structure 100 may be a redistribution substrate manufactured by a redistribution process. In other embodiments, the first redistribution structure 100 may also be a printed circuit board (PCB).

The first semiconductor package 300 may include a first semiconductor chip 310, a second semiconductor chip 330, an adhesive layer 370, a conductive pillar 380, and a molding member 390. The first semiconductor package 300 may be mounted on the upper surface of the first redistribution structure 100.

The first semiconductor chip 310 may be disposed on the upper surface of the first redistribution structure 100. The second semiconductor chip 330 may be stacked on the first semiconductor chip 310. The second semiconductor chip 330 may be disposed on an upper surface of the first semiconductor chip 310. According to embodiments, the first semiconductor chip 310 and the second semiconductor chip 330 may be disposed on one side surface (e.g., on one side) of the upper surface of the first redistribution structure 100. According to embodiments, a horizontal level of a center of the first semiconductor chip 310 in a first direction X may be arranged more leftward or rightward than a horizontal level of a center of the first redistribution structure 100 in the first direction X. In other words, the first semiconductor chip 310 may be disposed close to one side in the upper surface of the first redistribution structure 100.

The second semiconductor chip 330 may not overlap the second redistribution structure 200 in a vertical direction. The second semiconductor chip 330 may be thicker than the first semiconductor chip 310. According to embodiments, an upper surface of the second semiconductor chip 330 may be at a vertical level which is higher than an upper surface of the second redistribution structure 200.

The first semiconductor chip 310 and the second semiconductor chip 330 may respectively include a first semiconductor substrate 314 and a second semiconductor substrate 334. The first semiconductor chip 310 and the second semiconductor chip 330 may be higher in heat transfer coefficient than the second semiconductor package 400.

Each of the first semiconductor chip 310 and the second semiconductor chip 330 may be a logic chip or a memory chip. For example, the first semiconductor chip 310 and the second semiconductor chip 330 may be the same kind of memory chips, or one of the first semiconductor chip 310 and the second semiconductor chip 330 may be a memory chip and the other may be a logic chip. In some embodiments, at least one of the first semiconductor chip 310 and the second semiconductor chip 330 may have a chiplet structure including a plurality of chiplets.

The memory chip may be, for example, a volatile memory chip, such as dynamic random access memory (RAM) (DRAM) or static RAM (RAM), or a non-volatile memory chip, such as phase-change RAM (PRAM), magnetoresistive RAM (MRAM), ferroelectric RAM (FeRAM), or resistive RAM (RRAM). The logic chip may be, for example, an analog device, a digital signal processor, or a microprocessor, such as a central processing unit (CPU), a graphics processing unit (GPU), or an application processor (AP).

The adhesive layer 370 may be configured to attach the second semiconductor chip 330 on the first semiconductor chip 310. The adhesive layer 370 may be disposed between the first semiconductor chip 310 and the second semiconductor chip 330.

The conductive pillar 380 may be disposed apart from a sidewall of each of the first semiconductor chip 310 and the second semiconductor chip 330 in the first or second horizontal direction X or Y. The conductive pillar 380 may pass through the molding member 390 and may extend in the vertical direction Z. The conductive pillar 380 may be, for example, a through mold via or a conductive post. The conductive pillar 380 may include, for example, copper (Cu).

The conductive pillar 380 may be a vertical connection conductor for connecting the second redistribution structure 200 with the first redistribution structure 100.

The molding member 390 may be disposed on the upper surface of the first redistribution structure 100 and may cover at least a portion of the first semiconductor chip 310 and at least a portion of the conductive pillar 380. According to embodiments, the molding member 390 may cover the first semiconductor chip 310 and may surround at least a portion of the second semiconductor chip 330. The molding member 390 may extend in at least one of the first or second horizontal direction X or Y along the sidewall of the first semiconductor chip 310.

In embodiments, a vertical level of an upper surface of the molding member 390 may be higher than or equal to that of the upper surface of the first semiconductor chip 310. In embodiments, the upper surface of the molding member 390 may be disposed on a plane which is higher than or equal to the upper surface of the first semiconductor chip 310. In some embodiments, the upper surface of the second semiconductor chip 330 may be at a vertical level which is higher than the upper surface of the molding member 390.

In embodiments, the molding member 390 may include an insulation polymer or epoxy resin. For example, the molding member 390 may include an epoxy mold compound (EMC).

The second redistribution structure 200 may include layers which are mutually stacked in the vertical direction Z. The second redistribution structure 200 may include an upper surface and a lower surface, which are opposite to each other, and one of the upper surface and the lower surface thereof may be a planar surface.

The second redistribution structure 200 may be disposed on the upper surface of the molding member 390. According to embodiments, the second redistribution structure 200 may be disposed on one side surface (e.g., on one side) of the molding member 390. The second redistribution structure 200 may be formed to cover a portion of the upper surface of the molding member 390. The upper surface of the second redistribution structure 200 may be at a vertical level which is higher than the upper surface of the first semiconductor chip 310. A footprint of the second redistribution structure 200 may be less than that of the first redistribution structure 100.

According to embodiments, the second redistribution structure 200 may be disposed apart from the sidewall of the second semiconductor chip 330 in the first direction X or the second direction Y.

The second semiconductor package 400 may be mounted on the upper surface of the second redistribution structure 200. The second semiconductor package 400 may be disposed apart from the sidewall of the second semiconductor chip 330 of the first semiconductor package 300 in the first direction X.

The height h1 shown in FIG. 1, which is a vertical distance up to the upper surface of the second semiconductor package 400 from the lower surface of the first redistribution structure 100, may be in a range of about 1.1 mm to about 1.2 mm, but is not limited thereto.

According to embodiments, the second semiconductor package 400 may be lower in thermal conductance than the first semiconductor package 300. When heat occurs in the semiconductor package 10, heat may be discharged to the outside more through the first semiconductor package 300 which is high in thermal conductance.

In a general semiconductor package to which a three-dimensional (3D) integrated circuit (IC) and a package on package (PoP) are applied, the molding member 390 may cover the upper surface of the first semiconductor package 300, and the second redistribution structure 200 may be disposed apart from the upper surface of the first semiconductor package 300 in a vertical direction with the molding member 390 therebetween. The first semiconductor package 300, which includes silicon and is relatively high in thermal conductance may be covered by the molding member 390 which is lower in thermal conductance, and a thickness of the first semiconductor package 300 may be less than that of the molding member 390. Therefore, when heat occurs in the first semiconductor package 300, the heat may not efficiently be dissipated to the molding member 390.

However, in the semiconductor package 10 according to an embodiment, the first semiconductor package 300 may be disposed sideward in a direction toward one side surface instead of a center of the first redistribution structure 100 and the molding member 390 may surround only a portion of a side surface of the first semiconductor package 300, and thus, heat occurring in the semiconductor package 10 may be easily dissipated to the outside through the second semiconductor chip 330. Also, as a thickness of the second semiconductor chip 330 of the first semiconductor package 300 is more thickened than a conventional thickness, an area where the second semiconductor chip 330 contacts the outside may increase, and thus, heat occurring in the semiconductor package 10 may be easily dissipated to the outside through the second semiconductor chip 330. An internal connection structure of the semiconductor package 10 according to an embodiment will be described in more detail with reference to FIGS. 2A to 4.

Figure 2A:
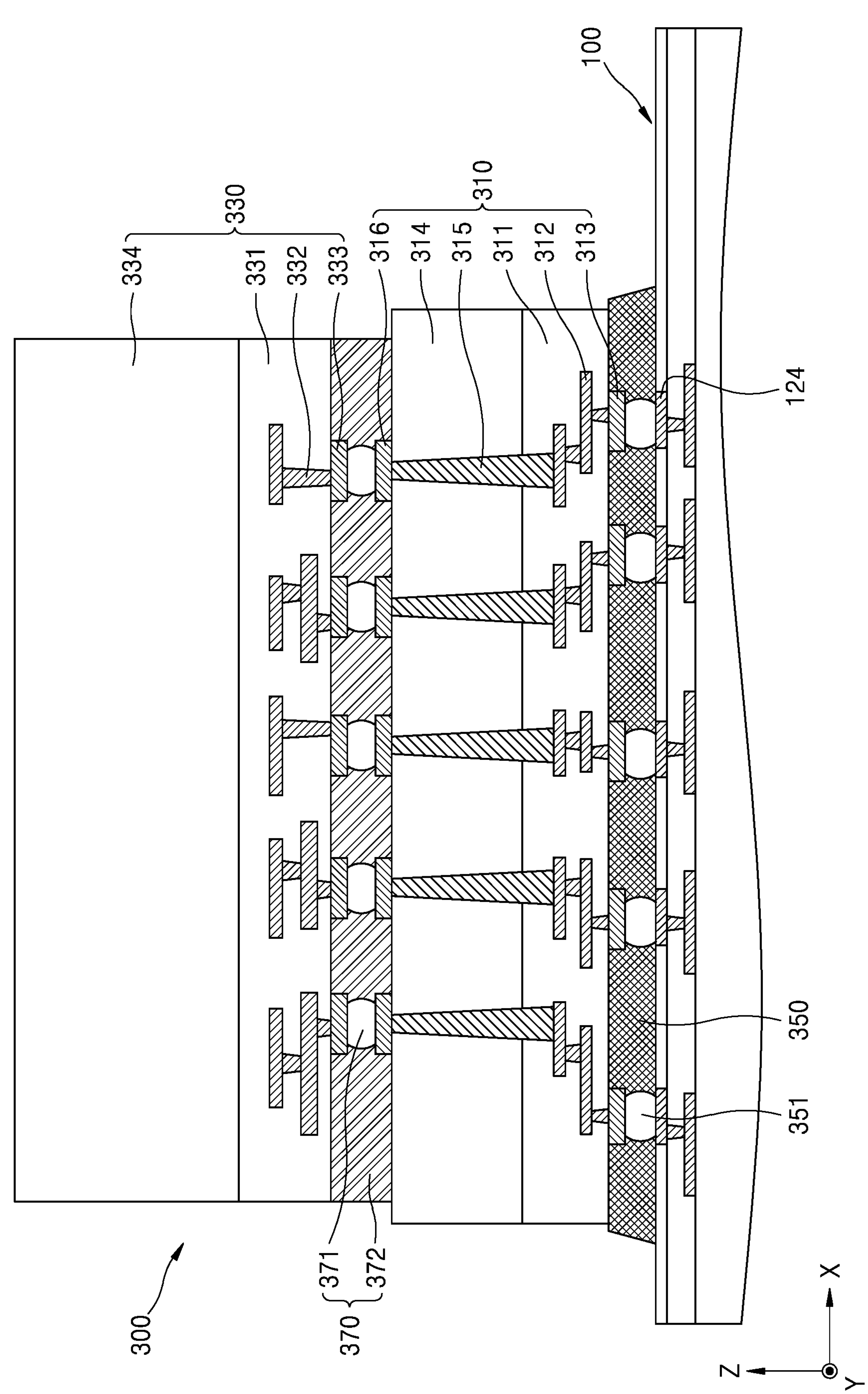
Figure 2B:
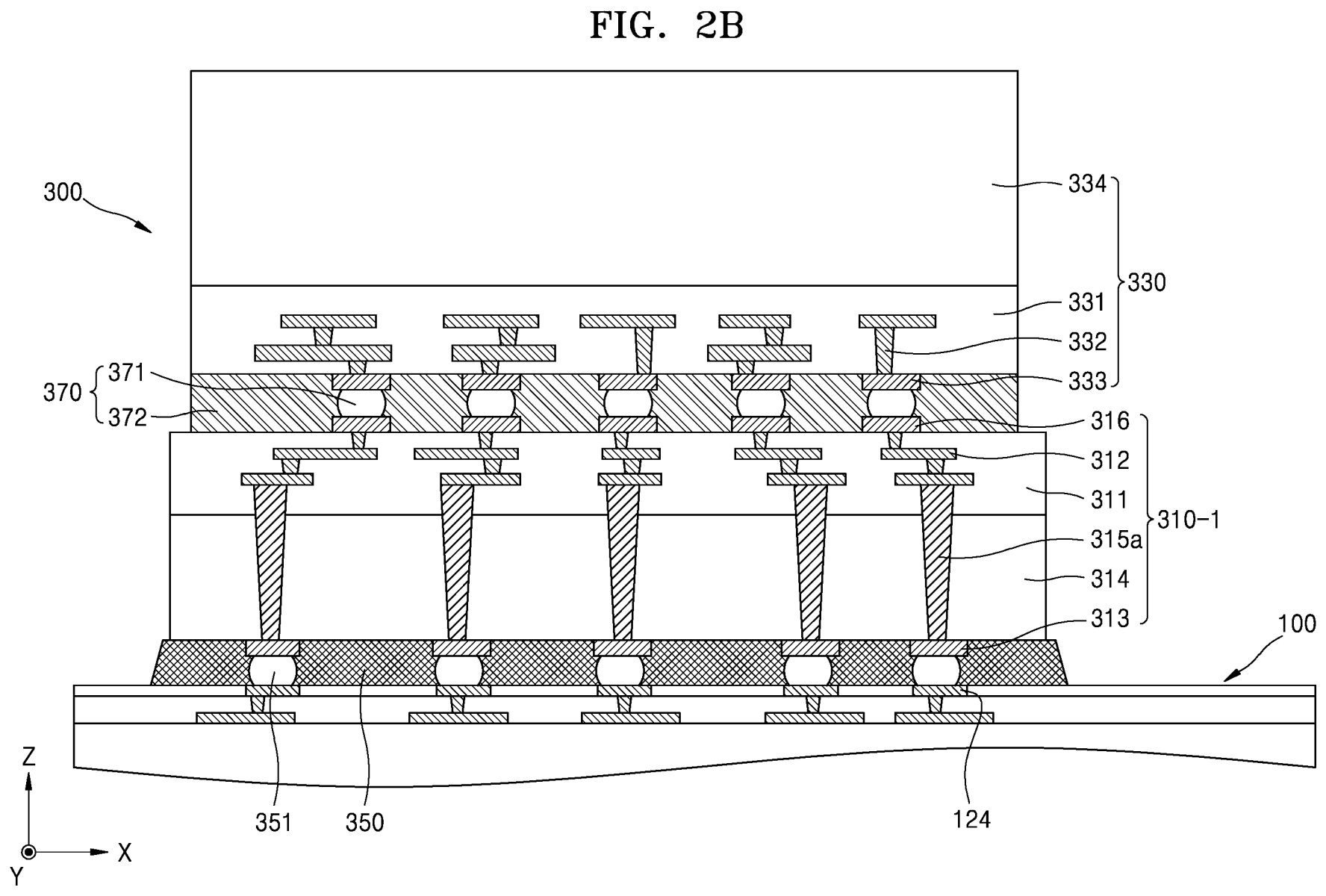

FIGS. 2A and 2B are enlarged views for describing a region AA in the semiconductor package 10 of FIG. 1, and for convenience of illustration, the molding member 390 illustrated in FIG. 1 is omitted in FIGS. 2A and 2B.

Referring to FIG. 2A, a first semiconductor package 300 may include a first semiconductor chip 310, a second semiconductor chip 330, an under-fill layer 350, and an adhesive layer 370.

The first semiconductor chip 310 may include a first semiconductor substrate 314, a first device layer 311, a first bump pad 313, and a second bump pad 316.

The first semiconductor substrate 314 may include an upper surface and a lower surface, which are opposite to each other. The upper surface of the first semiconductor substrate 314 may face the second semiconductor chip 330, and the lower surface thereof may face a first redistribution structure 100. The upper surface of the first semiconductor substrate 314 may be referred to as an inactive surface, and the lower surface thereof may be referred to as an active surface.

The first semiconductor substrate 314 may include, for example, crystalline silicon, poly-crystalline silicon, or amorphous silicon. Alternatively, the first semiconductor substrate 314 may include a semiconductor element, such as germanium (Ge), or a compound semiconductor, such as silicon carbide (SiC), gallium arsenide (GaAs), indium arsenide (InAs), or indium phosphide (InP). The first semiconductor substrate 314 may have a silicon on insulator (SOI) structure. For example, the first semiconductor substrate 314 may include a buried oxide (BOX) layer. The first semiconductor substrate 314 may include a conductive region, and for example, the first semiconductor substrate 314 may include an impurity-doped well or an impurity-doped structure. Also, the first semiconductor substrate 314 may have various device isolation structures, such as a shallow trench isolation (STI) structure.

The first device layer 311 may include a first wiring pattern 312, which is electrically connected with a plurality of semiconductor devices formed on the first semiconductor substrate 314. The first wiring pattern 312 may include a metal wiring layer and a via plug. For example, the first wiring pattern 312 may have a multilayer structure where two or more metal wiring layers or two or more via plugs are alternately stacked.

According to embodiments, the first device layer 311 may be formed on a lower surface, which is an active surface, of the first semiconductor substrate 314. The first device layer 311 may be disposed under the first semiconductor substrate 314. The first semiconductor substrate 314 may be apart from the first redistribution structure 100 in a vertical direction Z with the first device layer 311 therebetween. The first semiconductor chip 310 may include a through electrode 315 which passes through at least a portion of the first device layer 311 and the first semiconductor substrate 314.

The first bump pad 313 may be disposed on a lower surface of the first device layer 311 and may be electrically connected with a first wiring pattern 312 of the first device layer 311. The first bump pad 313 may be electrically connected with the through electrode 315 by way of the first wiring pattern 312.

The through electrode 315 may pass through at least a portion of each of the first semiconductor substrate 314 and the first device layer 311. The through electrode 315 may extend in the vertical direction Z toward an upper surface of the first semiconductor substrate 314 from the first device layer 311 and may be electrically connected with the first wiring pattern 312 included in the first device layer 311. Therefore, the first bump pad 313 may be electrically connected with the through electrode 315 by way of the first wiring pattern 312. The through electrode 315 may have a tapered shape where a width thereof in a horizontal direction decreases or increases progressively as a level based on the vertical direction Z increases (e.g., as a vertical level increases). At least a portion of the through electrode 315 may have a pillar shape. The through electrode 315 may be a through silicon via (TSV).

The second bump pad 316 may be formed on the upper surface of the first semiconductor substrate 314 (i.e., an inactive surface of the first semiconductor substrate 314). The second bump pad 316 may include substantially the same material as that of the first bump pad 313. Also, according to embodiments, a passivation layer may be formed on the upper surface of the first semiconductor substrate 314 to surround a portion of a side surface of the second bump pad 316.

The under-fill layer 350 may be disposed between the first semiconductor chip 310 and the first redistribution structure 100. The under-fill layer 350 may be disposed between the first semiconductor chip 310 and the first redistribution structure 100 to surround the first bump structure 351. The under-fill layer 350 may include, for example, epoxy resin formed by a capillary under-fill process. In some embodiments, the under-fill layer 350 may cover at least a portion of a side surface of the first semiconductor chip 310.

The first bump structure 351 may be disposed to contact the first bump pad 313. The first bump structure 351 may be disposed to contact a first upper pad 124 disposed on the first redistribution structure 100. The first bump structure 351 may electrically connect the first semiconductor package 300 with the first redistribution structure 100. The first semiconductor chip 310 may be supplied with, by way of the first bump structure 351, at least one of a control signal, a power signal, and a ground signal for an operation of the first semiconductor chip 310, may be supplied with a data signal, which is to be stored in the first semiconductor chip 310, from the outside, or may supply data stored in the first semiconductor chip 310 to the outside. For example, the first bump structure 351 may include a pillar structure, a ball structure, or a solder layer.

The second semiconductor chip 330 may include a second semiconductor substrate 334, a second device layer 331, and a third bump pad 333. The second semiconductor chip 330 may have a feature which is the same as or similar to that of the first semiconductor chip 310, and thus, a difference with the first semiconductor chip 310 will be mainly described.

The second semiconductor substrate 334 may include an upper surface and a lower surface, which are opposite to each other. The lower surface of the second semiconductor substrate 334 may face the first semiconductor chip 310, and the upper surface thereof may be opposite to the lower surface thereof. The upper surface of the second semiconductor substrate 334 may be referred to as an inactive surface, and the lower surface thereof may be referred to as an active surface.

The second device layer 331 may include a second wiring pattern 332, which is electrically connected with a plurality of semiconductor devices formed on the second semiconductor substrate 334. The second wiring pattern 332 may include a metal wiring layer and a via plug. For example, the second wiring pattern 332 may have a multilayer structure where two or more metal wiring layers and two or more via plugs are alternately stacked.

According to embodiments, the second device layer 331 may be formed on a lower surface, which is an active surface, of the second semiconductor substrate 334. The second device layer 331 may be disposed under the second semiconductor substrate 334. The second semiconductor substrate 334 may be apart from the first semiconductor chip 310 in the vertical direction Z with the second device layer 331 therebetween.

The third bump pad 333 may be disposed on a lower surface of the second device layer 331 and may be electrically connected with the second wiring pattern 332 of the second device layer 331.

The adhesive layer 370 may be disposed between the first semiconductor chip 310 and the second semiconductor chip 330. The adhesive layer 370 may electrically connect the first semiconductor chip 310 with the second semiconductor chip 330 and may fix the second semiconductor chip 330 to the first semiconductor chip 310. The adhesive layer 370 may include a second bump structure 371 and a die attach film 372.

The second bump structure 371 may be disposed to contact the second bump pad 316 and the third bump pad 333. The second bump structure 371 may electrically connect the first semiconductor chip 310 with the second semiconductor chip 330. The second semiconductor chip 330 may be electrically connected with the first semiconductor chip 310 by way of the second bump structure 371 disposed between the first semiconductor chip 310 and the second semiconductor chip 330. The second semiconductor chip 330 may be supplied with, by way of the second bump structure 371, at least one of a control signal, a power signal, and a ground signal for an operation of the second semiconductor chip 330, may be supplied with a data signal, which is to be stored in the second semiconductor chip 330, from the outside, or may supply data stored in the second semiconductor chip 330 to the outside.

The die attach film 372 may be disposed between the upper surface of the first semiconductor chip 310 and the lower surface of the second semiconductor chip 330. The die attach film 372 may attach the second semiconductor chip 330 to the first semiconductor chip 310. The die attach film 372 may directly contact the first semiconductor chip 310 and the second semiconductor chip 330 and may be disposed to surround the second bump structure 371. The die attach film 372 may be classified into an inorganic adhesive and a polymer adhesive. A polymer may be classified into thermo-curable resin and thermo-plastic resin, and moreover, may be a hybrid type obtained by mixing two components.

FIG. 2B is an enlarged view illustrating an embodiment of the region AA in the semiconductor package 10 of FIG. 1. Hereinafter, repeated descriptions of the first semiconductor package of FIG. 2A and the second semiconductor package of FIG. 2B are omitted, and a difference therebetween will be mainly described.

Referring to FIG. 2B, a first semiconductor package 300 may include a first semiconductor chip 310-1, a second semiconductor chip 330, an under-fill layer 350, and an adhesive layer 370.

The first semiconductor chip 310-1 may include a first semiconductor substrate 314, a first device layer 311, a first bump pad 313, and a second bump pad 316.

The first semiconductor substrate 314 may include an upper surface and a lower surface, which are opposite to each other. The upper surface of the first semiconductor substrate 314 may face the second semiconductor chip 330, and the lower surface thereof may face a first redistribution structure 100. The upper surface of the first semiconductor substrate 314 may be referred to as an active surface, and the lower surface thereof may be referred to as an inactive surface. The first semiconductor substrate 314 may be disposed on the upper surface of the first redistribution structure 100.

The first device layer 311 may include a first wiring pattern 312, which is electrically connected with a plurality of semiconductor devices formed on the first semiconductor substrate 314.

According to embodiments, the first device layer 311 may be formed on an upper surface, which is an active surface, of the first semiconductor substrate 314. The first device layer 311 may be disposed under the first semiconductor substrate 314. The first device layer 311 may be apart from the first redistribution structure 100 in a vertical direction Z with the first semiconductor substrate 314 therebetween.

The first bump pad 313 may be disposed on the lower surface of the first semiconductor substrate 314 and may be electrically connected with a through electrode 315*a*. The first bump pad 313 may be electrically connected with a first wiring pattern 312 by way of the through electrode 315*a*.

The through electrode 315*a* may pass through a portion of each of the first semiconductor substrate 314 and the first device layer 311. The through electrode 315*a* may extend in the vertical direction Z toward an upper surface of the first semiconductor substrate 314 from the first device layer 311 and may be electrically connected with the first wiring pattern 312 included in the first device layer 311. The through electrode 315*a* may have a tapered shape where a width thereof in a horizontal direction increases progressively as a level based on the vertical direction Z increases (e.g., as a vertical level increases). At least a portion of the through electrode 315*a* may have a pillar shape. The through electrode 315*a* may be a TSV.

The second bump pad 316 may be formed on an upper surface of the first device layer 311. The second bump pad 316 may include substantially the same material as that of the first bump pad 313. Also, according to embodiments, a passivation layer may be formed on the upper surface of the first semiconductor substrate 314 to surround a portion of a side surface of the second bump pad 316.

An active surface of the first semiconductor chip 310-1 of the first semiconductor package 300 may be disposed to face the second semiconductor chip 330, and thus, an electric signal may be quickly transferred between the first semiconductor chip 310-1 and the second semiconductor chip 330.

Figure 3:
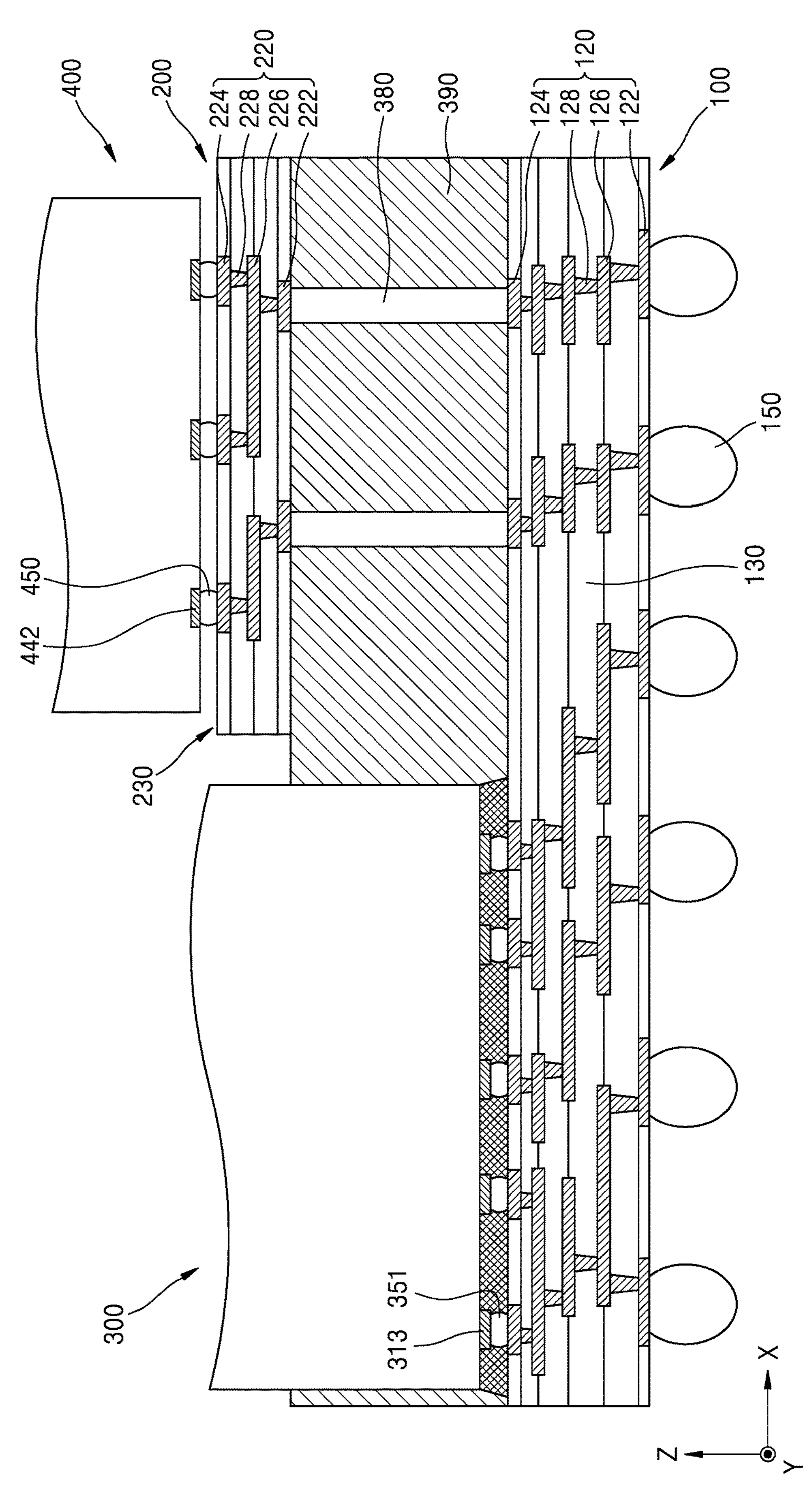
FIG. 3 is a cross-sectional view for describing a connection relationship of the semiconductor package of FIG. 1.

FIG. 3 is a cross-sectional view for describing a connection relationship of the semiconductor package 10 of FIG. 1. Referring to FIG. 3, a semiconductor package 10 may include a first redistribution structure 100, a first semiconductor structure 300, a second redistribution structure 200, and a second semiconductor package 400.

The first redistribution structure 100 may include a plurality of first redistribution patterns 120 and a plurality of first insulation layers 130 surrounding the plurality of first redistribution patterns 120. The first insulation layer 130 may be formed from, for example, a photo imageable dielectric (PID) or a photosensitive polyimide (PSPI).

The plurality of first redistribution patterns 120 may include a first upper wiring pattern which is disposed on an upper surface of the first redistribution structure 100 and includes a plurality of first upper pads 124, a first lower wiring pattern which is disposed on a lower surface of the first redistribution structure 100 and includes a plurality of first lower pads 122, and a plurality of first conductive via patterns 128 which pass through the first insulation layer 130 and electrically connect the first redistribution patterns 120, disposed on different wiring layers, with one another. A wiring layer may denote an electric path extending in an X-Y plane. For example, the first redistribution structure 100 may include a wiring layer on an upper surface and a lower surface of the first insulation layer 130.

In some embodiments, the first redistribution structure 100 may further include a first conductive line pattern 126 which extends in a horizontal direction in the first insulation layer 130. For example, the first conductive line pattern 126 may be disposed to configure a wiring layer between two adjacent first insulation layers 130.

Each of upper ends and lower ends of the plurality of first conductive via patterns 128 may contact one of a portion of the first upper wiring pattern, a portion of the first lower wiring pattern, and a portion of the first conductive line pattern 126. The first redistribution pattern 120 may include, for example, metal such as copper (Cu), aluminum (Al), tungsten (W), titanium (Ti), tantalum (Ta), indium (In), molybdenum (Mo), manganese (Mn), cobalt (Co), zinc (Sn), nickel (Ni), magnesium (Mg), rhenium (Re), beryllium (Be), gallium (Ga), or ruthenium (Ru), or an alloy thereof, but is not limited thereto. In some embodiments, the first redistribution pattern 120 may be formed by stacking metal or a metal alloy on a seed layer including Cu, Ti, titanium nitride, or titanium tungsten.

Each of the plurality of first conductive via patterns 128 may pass through the first insulation layer 130 and may be connected with at least one of the first upper wiring pattern, the first lower wiring pattern, or the first conductive line pattern 126. In some embodiments, the plurality of first conductive via patterns 128 may have a tapered shape where a horizontal width enlarges and extends from a lower side thereof to an upper side thereof. For example, the plurality of first conductive via patterns 128 may have a horizontal width which enlarges toward the first semiconductor package 300.

In some embodiments, at least one of the first upper wiring pattern, the first lower wiring pattern, or the first conductive line pattern 126 may be formed along with at least one of the plurality of first conductive via patterns 128 and may be provided as one body. For example, the first upper wiring pattern and the first conductive via pattern 128 contacting a lower surface of the first upper wiring pattern may be formed together and provided as one body, or the first conductive line pattern 126 and the first conductive via pattern 128 contacting a lower surface of the first conductive line pattern 126 may be formed together and provided as one body. For example, each of the plurality of first conductive via patterns 128 may have a horizontal width which narrows in a direction away from the first upper wiring pattern, the first lower wiring pattern, or the first conductive line pattern 126.

An external connection terminal 150 may be disposed on the first lower pad 122 disposed on a lower surface of the first redistribution structure 100. The external connection terminal 150 may be electrically connected with the first lower pad 122. The external connection terminal 150 may be electrically connected with the first redistribution patterns 120 by way of the first lower pad 122. The external connection terminal 150 may be electrically connected with, for example, a mother board. Therefore, the first semiconductor package 300 may be electrically connected with an external device by way of the first bump structure 351, the first upper pad 124, the first conductive via pattern 128, the first conductive line pattern 126, the first lower pad 122, and the external connection terminal 150.

The second redistribution structure 200 may include a plurality of second redistribution patterns 220 and a plurality of second insulation layers 230 surrounding the plurality of second redistribution patterns 220. The second insulation layer 230 and the second redistribution patterns 220 may be substantially the same as or similar to the first insulation layer 130 and the first redistribution patterns 120, respectively, and thus, differences therebetween will be mainly described.

The plurality of second redistribution patterns 220 may include a second upper wiring pattern which is disposed on an upper surface of the second redistribution structure 200 and includes a plurality of second upper pads 224, a second lower wiring pattern which is disposed on a lower surface of the second redistribution structure 200 and includes a plurality of second lower pads 222, and a plurality of second conductive via patterns 228 which pass through the second insulation layer 230 and electrically connect the second redistribution patterns 220, disposed on different wiring layers, with one another.

In some embodiments, the second redistribution structure 200 may further include a second conductive line pattern 226 which extends in a horizontal direction in the second insulation layer 230. For example, the second conductive line pattern 226 may be disposed to configure a wiring layer between two adjacent second insulation layers 230.

Each of upper ends and lower ends of the plurality of second conductive via patterns 228 may contact one of a portion of the second upper wiring pattern, a portion of the second lower wiring pattern, and a portion of the second conductive line pattern 226. In some embodiments, the plurality of second conductive via patterns 228 may have a tapered shape where a horizontal width enlarges and extends from a lower side thereof to an upper side thereof. For example, the second upper wiring pattern and the second conductive via pattern 228 contacting a lower surface of the second upper wiring pattern may be formed together and provided as one body, and/or the second conductive line pattern 226 and the second conductive via pattern 228 contacting a lower surface of the second conductive line pattern 226 may be formed together and provided as one body.

The first semiconductor package 300 may include a conductive pillar 380 which passes through the molding member 390 in the vertical direction Z. The conductive pillar 380 may be disposed apart from the first semiconductor chip 310 in a first horizontal direction X.

A lower end of the conductive pillar 380 may contact the first upper pad 124 of the first redistribution structure 100, and an upper end of the conductive pillar 380 may contact the second lower pad 222 of the second redistribution structure 200. The conductive pillar 380 may electrically connect the first upper pad 124 with the second lower pad 222. The conductive pillar 380 may electrically connect the first redistribution structure 100 with the second redistribution structure 200 by way of the first upper pad 124 and the second lower pad 222.

Figure 4:
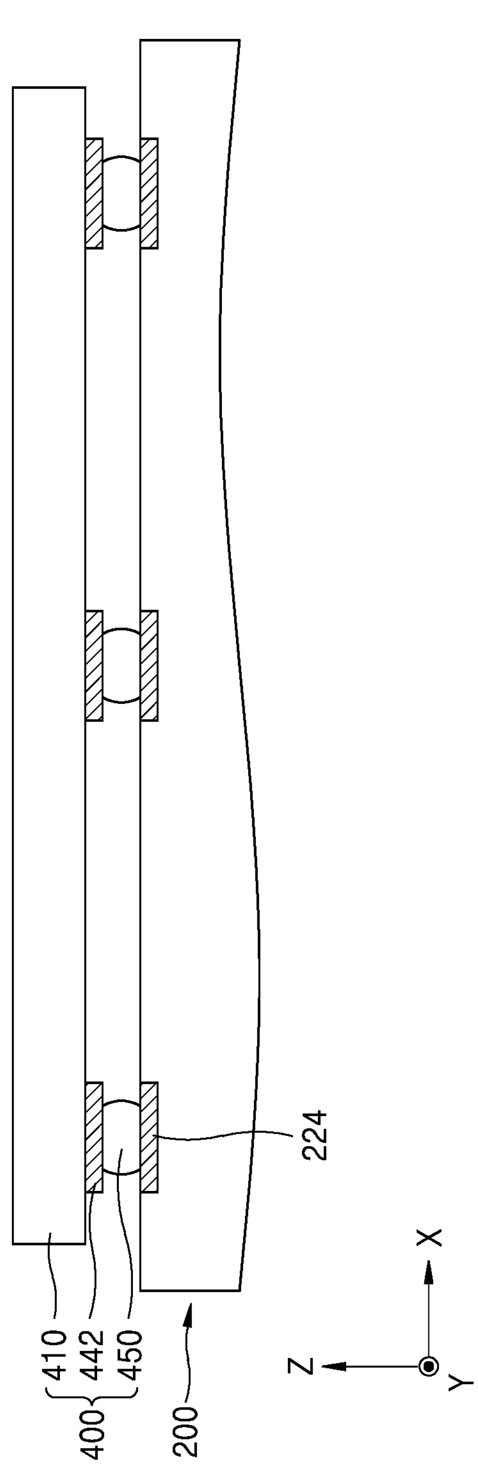
FIG. 4 is an enlarged view for describing a region BB in the semiconductor package of FIG. 1.

FIG. 4 is an enlarged view for describing a region BB in the semiconductor package 10 of FIG. 1.

A second semiconductor package 400 may include a third semiconductor chip 410, a fourth bump pad 442, and a package connection terminal 450.

The third semiconductor chip 410 may be disposed on an upper surface of the second redistribution structure 200. The third semiconductor chip 410 may be a memory chip, and for example, may be a DRAM chip. In this case, the second semiconductor package 400 may be a DRAM package.

The fourth bump pad 442 may be disposed on a lower surface of the second semiconductor package 400. The fourth bump pad 442 may be electrically connected with the third semiconductor chip 410.

The package connection terminal 450 may contact an upper surface of the second upper pad 224 and a lower surface of the fourth bump pad 442. The package connection terminal 450 may electrically connect the second semiconductor package 400 with the second redistribution structure 200. The second semiconductor package 400 may be electrically connected with the first semiconductor package 300 of FIGS. 1 to 3 by way of the package connection terminal 450.

The third semiconductor chip 410 may be supplied with, by way of the package connection terminal 450, at least one of a control signal, a power signal, and a ground signal for an operation of the third semiconductor chip 410, may be supplied with a data signal, which is to be stored in the third semiconductor chip 410, from the outside, or may supply data stored in the third semiconductor chip 410 to the outside. For example, the package connection terminal 450 may include a pillar structure, a ball structure, or a solder layer.

Figure 5:
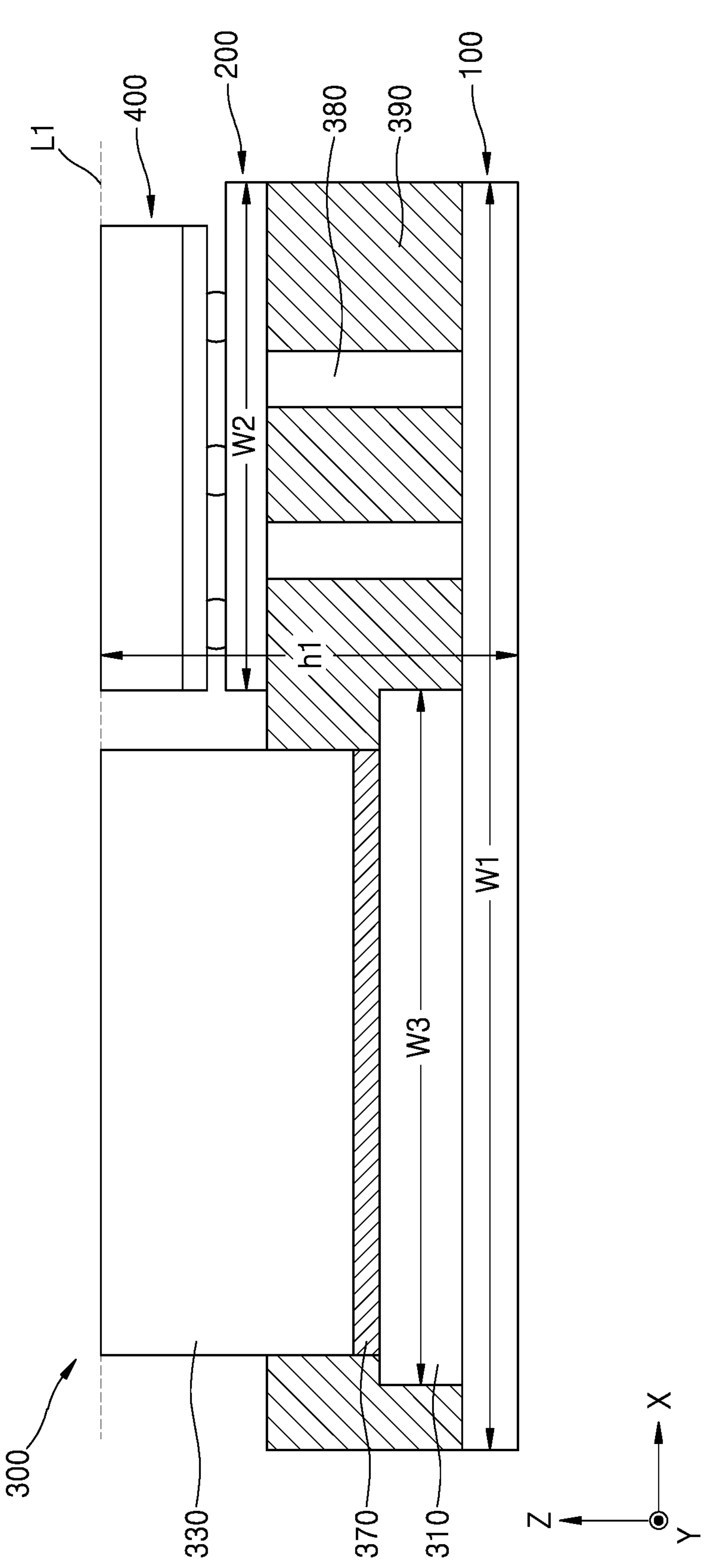
FIG. 5 is a cross-sectional view illustrating a semiconductor package according to an embodiment.

FIG. 5 is a cross-sectional view illustrating a semiconductor package 11 according to an embodiment. Hereinafter, repeated descriptions of the semiconductor package 11 of FIG. 5 and the semiconductor package 10 of FIG. 1 are omitted, and a difference therebetween will be mainly described.

Referring to FIG. 5, the semiconductor package 11 may include a first redistribution structure 100, a first semiconductor package 300, a second redistribution structure 200, and a second semiconductor package 400.

The first semiconductor package 300 may include a first semiconductor chip 310, an adhesive layer 370, a molding member 390, a conductive pillar 380, and a second semiconductor chip 330. The first semiconductor chip 310 may be disposed on an upper surface of the first redistribution structure 100, the second semiconductor chip 330 may be stacked on an upper surface of the first semiconductor chip 310 in a vertical direction, and the adhesive layer 370 may be disposed between the first semiconductor chip 310 and the second semiconductor chip 330 to attach the second semiconductor chip 330 on the first semiconductor chip 310.

Also, the height h1 which is a distance up to an upper surface of the second semiconductor package 400 from a lower surface of the first redistribution structure 100 may be in a range of about 1.1 mm to about 1.2 mm and may be equal to a distance up to an upper surface of the second semiconductor chip 330 from the lower surface of the first redistribution structure 100. The upper surface of the second semiconductor chip 330 and the upper surface of the second semiconductor package 400 may be disposed at the same vertical level. In other words, a rectilinear line L1 contacting the upper surface of the second semiconductor chip 330 may also contact the upper surface of the second semiconductor package 400.

The second redistribution structure 200 may be disposed on one surface of the molding member 390. The second redistribution structure 200 may be formed to cover a portion of the upper surface of the molding member 390. A footprint of the second redistribution structure 200 may be less than that of the first redistribution structure 100. A horizontal length W2 of the second redistribution structure 200 may be less than a horizontal length W3 of the first redistribution structure 100.

Heat occurring in the semiconductor package 11 may be dissipated along the upper surface of the second semiconductor chip 330. That is, because the second semiconductor chip 330 is disposed at the same vertical level as the upper surface of the second semiconductor package 400, a vertical height of the semiconductor package 11 may be maintained, and an area where the second semiconductor chip 330 contacts the outside may enlarge. That is, as a vertical-direction thickness of the second semiconductor chip 330 increases, an area where a side surface of the second semiconductor chip 330 contacts the outside may increase. As a result, as an area where a side surface of the second semiconductor chip 330 contacts the outside increases, heat occurring in the semiconductor package 11 may be efficiently dissipated to the outside.

Figure 6:
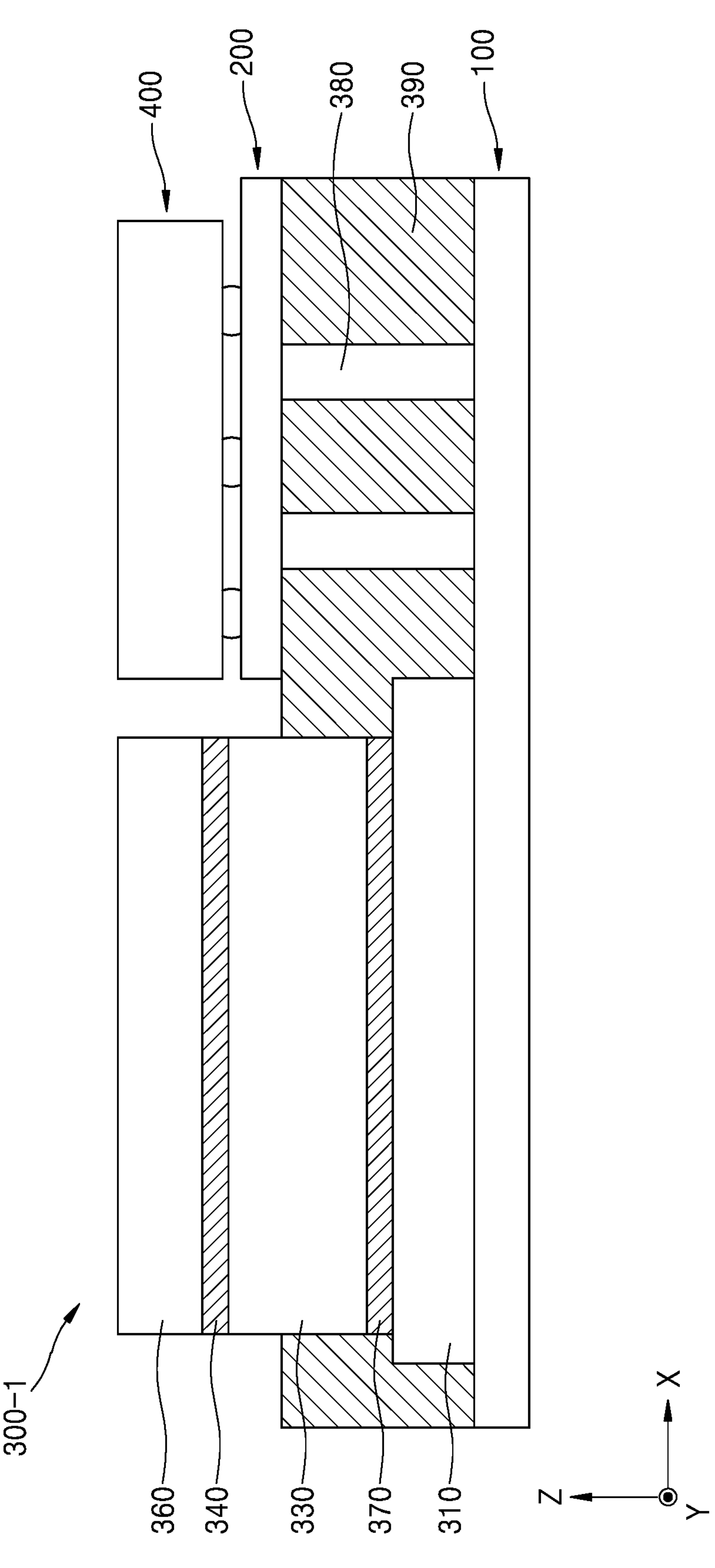
FIG. 6 is a cross-sectional view illustrating a semiconductor package according to an embodiment.

FIG. 6 is a cross-sectional view illustrating a semiconductor package 11-1 according to an embodiment. Hereinafter, repeated descriptions of the semiconductor package 11-1 of FIG. 6 and the semiconductor package 11 of FIG. 5 are omitted, and a difference therebetween will be mainly described.

Referring to FIG. 6, the semiconductor package 11-1 may include a first redistribution structure 100, a first semiconductor package 300-1, a second redistribution structure 200, and a second semiconductor package 400.

The first semiconductor package 300-1 may include a first semiconductor chip 310, an adhesive layer 370, a molding member 390, a conductive pillar 380, a second semiconductor chip 330, a die attach film 340, and a first dummy chip 360.

The first dummy chip 360 may be disposed on an upper surface of the second semiconductor chip 330. According to embodiments, the first dummy chip 360 may include silicon, but is not limited thereto and may include a material which is high in thermal conductance.

The die attach film 340 may be disposed between a lower surface of the first dummy chip 360 and an upper surface of the second semiconductor chip 330 to contact the first dummy chip 360 and the second semiconductor chip 330. The die attach film 340 may be classified into an inorganic adhesive and a polymer adhesive. A polymer may be classified into thermo-curable resin and thermo-plastic resin, and moreover, may be a hybrid type obtained by mixing two components.

The upper surface of the first dummy chip 360 and the upper surface of the second semiconductor package 400 may be disposed at the same vertical level. The upper surface of the first dummy chip 360 and the upper surface of the second semiconductor package 400 may be disposed on the same plane.

The first semiconductor chip 310 and the second semiconductor chip 330 may include silicon, the first dummy chip 360 may include silicon or a material which is high in thermal conductance, and the first semiconductor package 300-1 may be high in thermal conductance. Accordingly, most of the heat occurring in the semiconductor package 11-1 may be dissipated to the outside through the first semiconductor package 300-1.

As a result, the semiconductor package 11-1 including the first dummy chip 360 may efficiently dissipate heat, occurring in the semiconductor package 11-1, to the outside.

Figure 7:
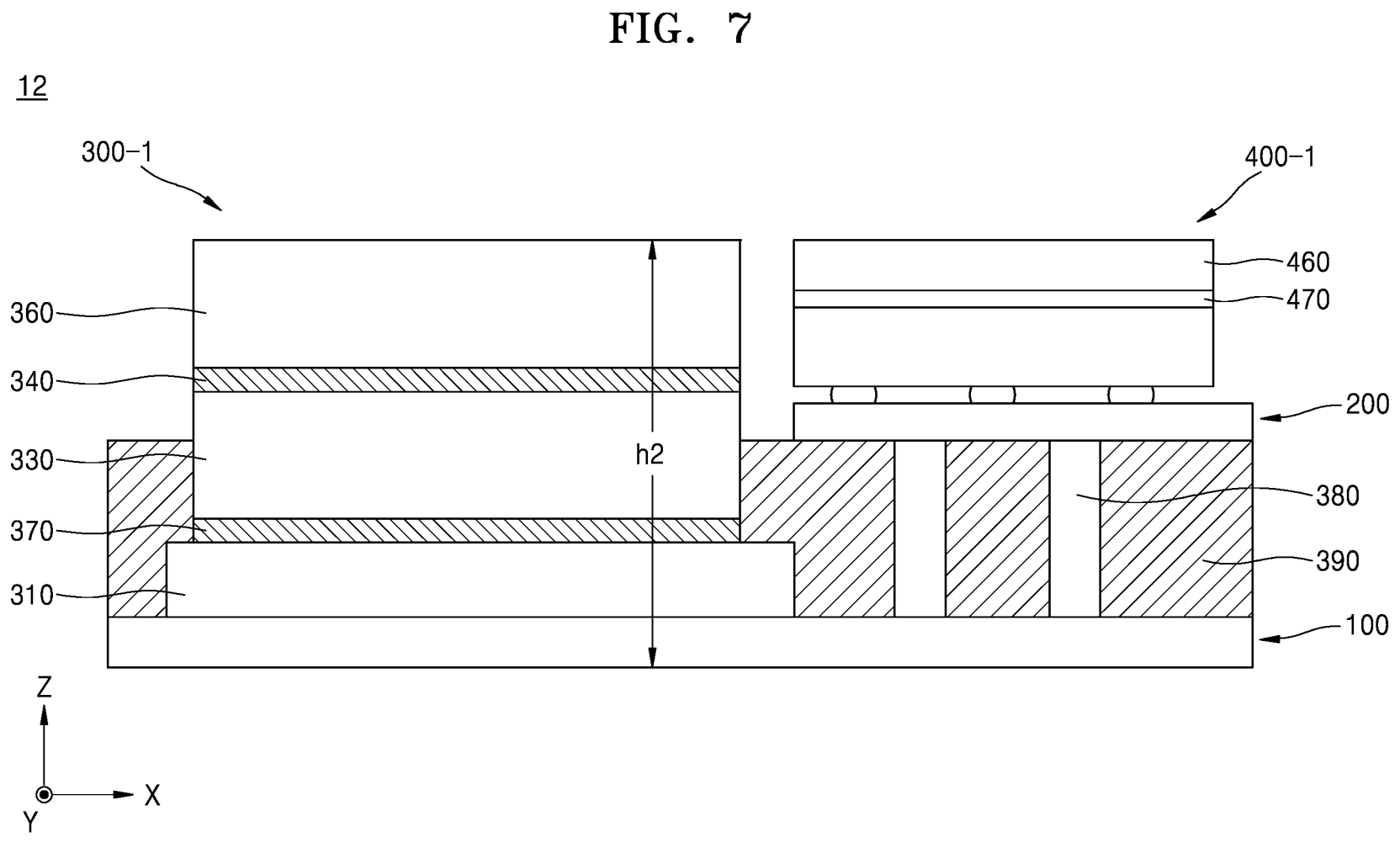

FIG. 7 is a cross-sectional view illustrating a semiconductor package 12 according to an embodiment. Hereinafter, repeated descriptions of the semiconductor package 12 of FIG. 7 and the semiconductor package 11-1 of FIG. 6 are omitted, and a difference therebetween will be mainly described.

Referring to FIG. 7, the semiconductor package 12 may include a first redistribution structure 100, a first semiconductor package 300-1, a second redistribution structure 200, and a second semiconductor package 400-1.

The first semiconductor package 300-1 may include a first semiconductor chip 310, an adhesive layer 370, a molding member 390, a conductive pillar 380, a second semiconductor chip 330, a die attach film 340, and a first dummy chip 360. The second semiconductor package 400-1 may further include a die attach film 470 and a second dummy chip 460.

The second dummy chip 460 may be disposed at an uppermost portion of the second semiconductor package 400-1. According to embodiments, the second dummy chip 460 may be stacked on an upper surface of the third semiconductor chip (e.g., 410 of FIG. 4).

The second dummy chip 460 may include silicon, but is not limited thereto and may include a material which is higher in thermal conductance than silicon.

The die attach film 470 may be disposed between the second dummy chip 460 and the third semiconductor chip 410 so that the second dummy chip 460 contacts the upper surface of the third semiconductor chip 410. The die attach film 470 of the second semiconductor package 400-1 may be substantially the same as or similar to the die attach film 340 of the first semiconductor package 300-1.

The upper surface of the first dummy chip 360 and the upper surface of the second dummy chip 460 may be disposed on the same plane. The upper surface of the first dummy chip 360 and the upper surface of the second dummy chip 460 may be disposed at the same vertical level.

The upper surface of the first semiconductor package 300-1 and the upper surface of the second semiconductor package 400-1 may be disposed at the same plane. The upper surface of the first semiconductor package 300-1 and the upper surface of the second semiconductor package 400-1 may be disposed at the same vertical level. In other words, a height up to the upper surface of the second semiconductor package 400-1 from the lower surface of the first redistribution structure 100 may be equal to a height up to the upper surface of the first semiconductor package 300-1 from the lower surface of the first redistribution structure 100.

Also, a height h2 up to the upper surface of the first semiconductor package 300-1 from the lower surface of the first redistribution structure 100 may be greater than a height h1 (see FIG. 1) up to the upper surface of the first semiconductor package (300 of FIG. 1) from the lower surface of the first redistribution structure 100 in the semiconductor package (10 of FIG. 1) of FIG. 1.

Accordingly, in the semiconductor package 12 according to an embodiment, the first semiconductor package 300-1 may include the first dummy chip 360 which is high in thermal conductance and the second semiconductor package 400-1 may include the second dummy chip 460 which is high in thermal conductance, and thus, heat occurring in the semiconductor package 12 may be efficiently dissipated to the outside.

Figure 8:
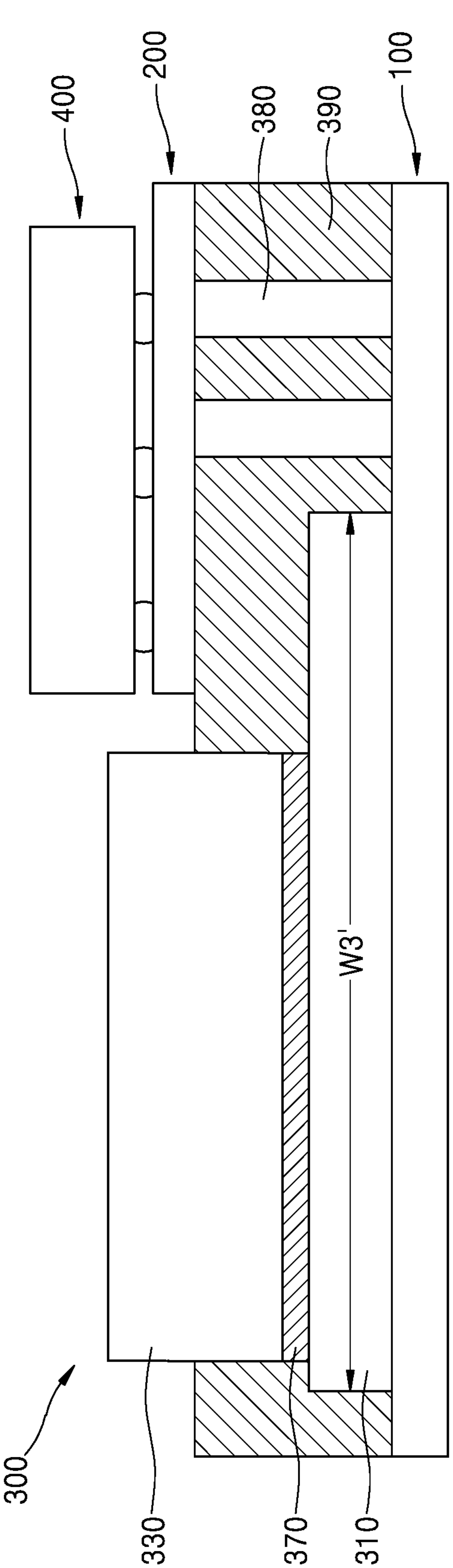
FIG. 8 is a cross-sectional view illustrating a semiconductor package according to an embodiment.

FIG. 8 is a cross-sectional view illustrating a semiconductor package 13 according to an embodiment. Hereinafter, repeated descriptions of the semiconductor package 13 of FIG. 8 and the semiconductor package 10 of FIG. 1 are omitted, and a difference therebetween will be mainly described.

Referring to FIG. 8, the semiconductor package 13 may include a first redistribution structure 100, a first semiconductor structure 300, a second redistribution structure 200, and a second semiconductor package 400.

The first semiconductor package 300 may include a first semiconductor chip 310, an adhesive layer 370, a molding member 390, a conductive pillar 380, and a second semiconductor chip 330.

The first semiconductor chip 310 may extend in a first horizontal direction X, and a portion of the first semiconductor chip 310 may overlap the second redistribution structure 200 in a vertical direction. A horizontal-direction length W3' of the first semiconductor chip 310 may be greater than the horizontal-direction length W3 (see FIG. 5) of the first semiconductor chip 310 of the semiconductor package 10 of FIG. 1. An area where an upper surface of the first semiconductor chip 310 contacts the molding member 390 may increase. A footprint of the first semiconductor chip 310 may be greater than that of the second semiconductor chip 330.

As the horizontal-direction length W3' of the first semiconductor chip 310 increases, conductive pillars 380 may be more densely disposed on one side surface of an upper surface of the first redistribution structure 100.

As a horizontal area of the first semiconductor chip 310 increases, a thermal conductance of the first semiconductor package 300 may increase. Accordingly, heat occurring in the semiconductor package 13 may be efficiently dissipated to the outside.

Figure 9:
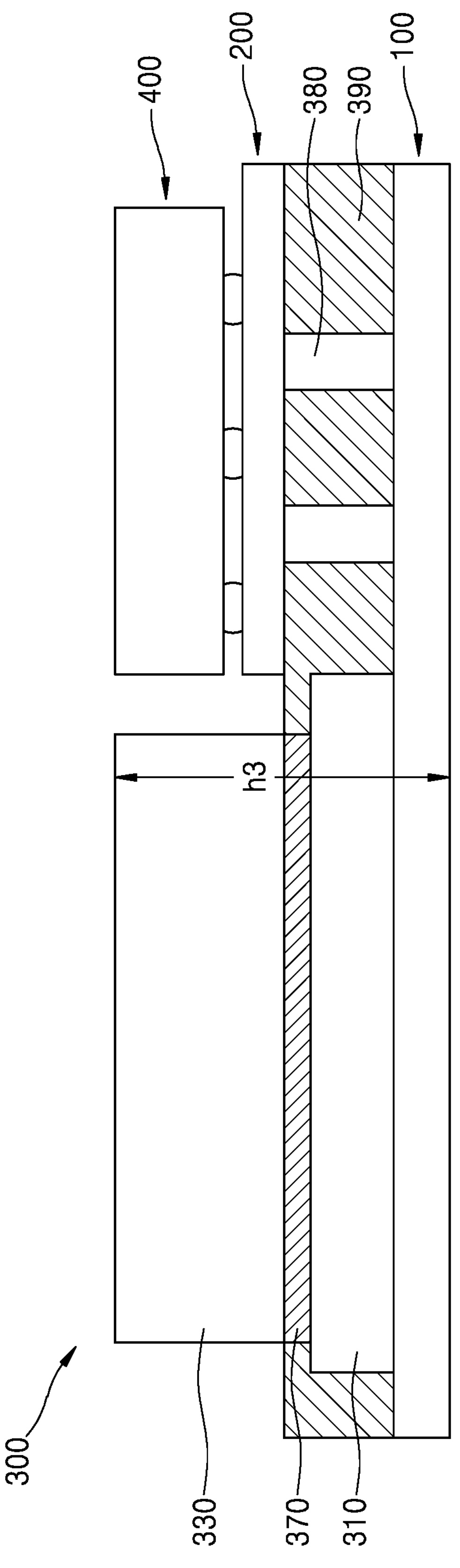
FIG. 9 is a cross-sectional view illustrating a semiconductor package according to an embodiment.

FIG. 9 is a cross-sectional view illustrating a semiconductor package 14 according to an embodiment. Hereinafter, repeated descriptions of the semiconductor package 14 of FIG. 9 and the semiconductor package 10 of FIG. 1 are omitted, and a difference therebetween will be mainly described.

Referring to FIG. 9, the semiconductor package 14 may include a first redistribution structure 100, a first semiconductor package 300, a second redistribution structure 200, and a second semiconductor package 400.

The first semiconductor package 300 may include a first semiconductor chip 310, an adhesive layer 370, a molding member 390, a conductive pillar 380, and a second semiconductor chip 330.

The molding member 390 may cover the first semiconductor chip 310, and an upper surface of the molding member 390 and a lower surface of the second semiconductor chip 330 may be disposed at the same vertical level. A lower surface of the second redistribution structure 200 disposed on the upper surface of the molding member 390 and the lower surface of the second semiconductor chip 330 may be disposed on the same plane. According to embodiments, the molding member 390 may cover the first semiconductor chip 310 and the adhesive layer 370, and the upper surface of the molding member 390 and the lower surface of the second semiconductor chip 330 disposed on the adhesive layer 370 may be disposed on the same plane.

Also, a height h3 up to the upper surface of the first semiconductor package 300 from the lower surface of the first redistribution structure 100 may be greater than the height h1 (see FIG. 1) up to the upper surface of the first semiconductor package 300 from the lower surface of the first redistribution structure 100 in the semiconductor package 10 of FIG. 1.

As a height of the molding member 390 having a low thermal conductance is reduced, a thermal conductance of the semiconductor package 14 may increase. Also, a height of the semiconductor package 14 may decrease as a height of the molding member is reduced and a heat transfer path may be shortened as a height of the semiconductor package 14 decreases, and thus, the semiconductor package 14 may be more miniaturized and heat occurring in the semiconductor package 14 may be efficiently dissipated to the outside.

Figure 10:
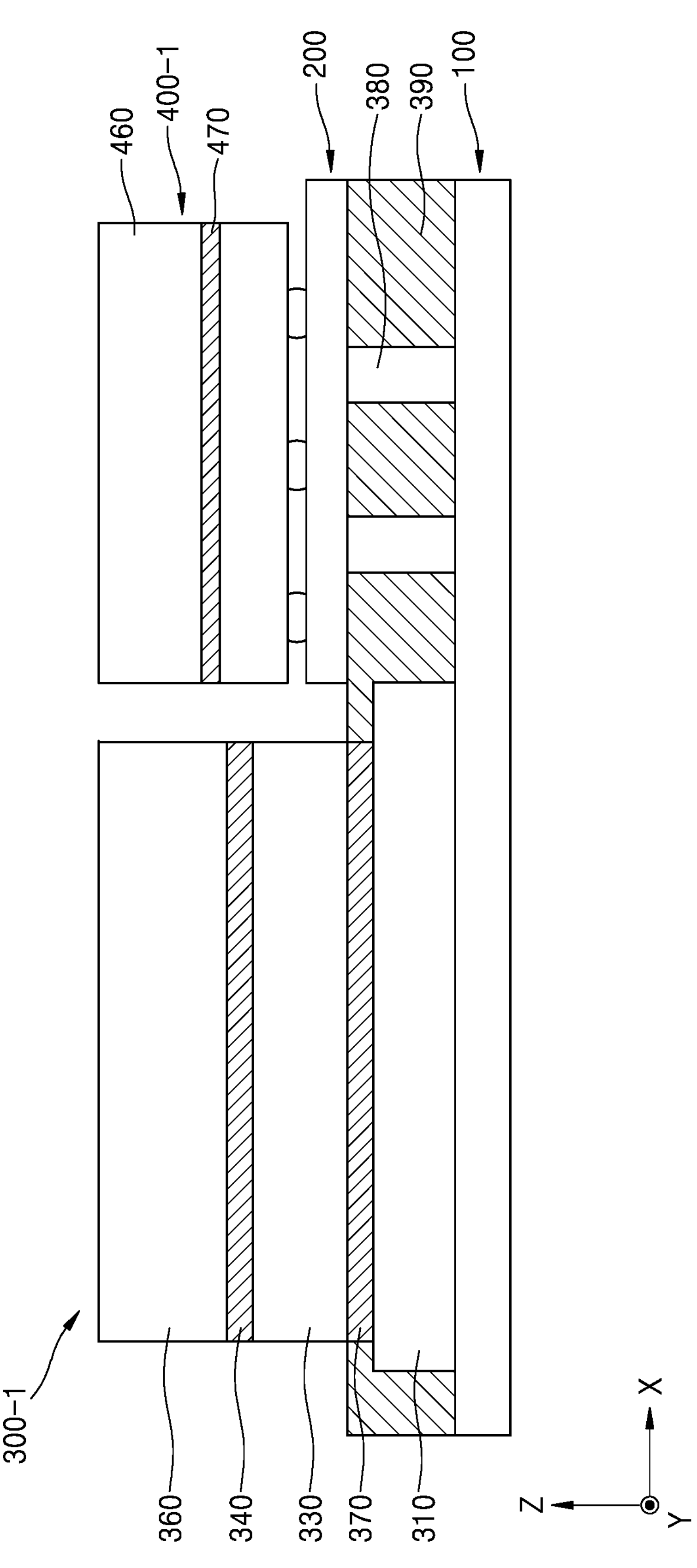
FIG. 10 is a cross-sectional view illustrating a semiconductor package according to an embodiment.

FIG. 10 is a cross-sectional view illustrating a semiconductor package 15 according to an embodiment. Hereinafter, repeated descriptions of the semiconductor package 15 of FIG. 10 and the semiconductor package 12 of FIG. 7 are omitted, and a difference therebetween will be mainly described.

Referring to FIG. 10, the semiconductor package 15 may include a first redistribution structure 100, a first semiconductor package 300-1, a second redistribution structure 200, and a second semiconductor package 400-1.

The first semiconductor package 300-1 may include a first semiconductor chip 310, an adhesive layer 370, a molding member 390, a conductive pillar 380, a second semiconductor chip 330, a die attach film 340, and a first dummy chip 360. The second semiconductor package 400-1 may further include a die attach film 470 and a second dummy chip 460.

The molding member 390 may cover the first semiconductor chip 310, and an upper surface of the molding member 390 and a lower surface of the second semiconductor chip 330 may be disposed at the same vertical level. A lower surface of the second redistribution structure 200 disposed on the upper surface of the molding member 390 and the lower surface of the second semiconductor chip 330 may be disposed on the same plane. According to embodiments, the molding member 390 may cover the first semiconductor chip 310 and the adhesive layer 370, and the upper surface of the molding member 390 and the lower surface of the second semiconductor chip 330 disposed on the adhesive layer 370 may be disposed on the same plane. The second semiconductor chip 330 may be stacked on the upper surface of the first semiconductor chip 310, and a side surface of the second semiconductor chip 330 may not contact the molding member 390.

Therefore, in the semiconductor package 15, a height of the molding member 390 having a low thermal conductance may decrease and the first semiconductor chip 300-1 and the second semiconductor chip 400-1 may respectively include a first dummy chip 360 and a second dummy chip 460 each having a high thermal conductance, and thus, a thermal conductance of the semiconductor package 15 may increase. Also, a height of the semiconductor package 15 may decrease as a height of the molding member 390 is reduced, a heat transfer path may be shortened as a height of the semiconductor package 15 decreases, and heat may be quickly dissipated through the first dummy chip 360 and the second dummy chip 460, and thus, heat occurring in the semiconductor package 15 may be efficiently dissipated to the outside.

Figure 11:
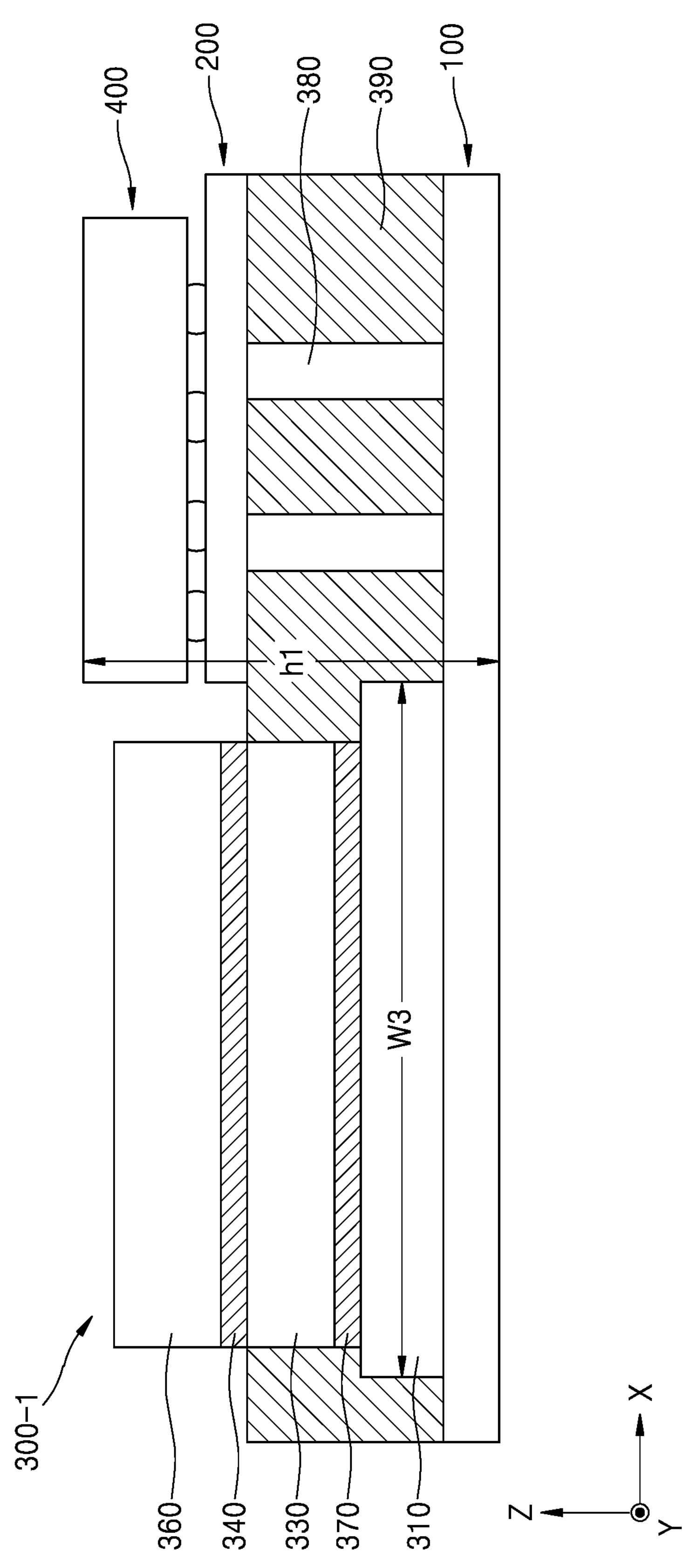
FIG. 11 is a cross-sectional view illustrating a semiconductor package according to an embodiment.

FIG. 11 is a cross-sectional view illustrating a semiconductor package 16 according to an embodiment. Hereinafter, repeated descriptions of the semiconductor package 16 of FIG. 11 and the semiconductor package 11-1 of FIG. 6 are omitted, and a difference therebetween will be mainly described.

Referring to FIG. 11, the semiconductor package 16 may include a first redistribution structure 100, a first semiconductor package 300-1, a second redistribution structure 200, and a second semiconductor package 400.

The first semiconductor package 300-1 may include a first semiconductor chip 310, an adhesive layer 370, a molding member 390, a conductive pillar 380, a second semiconductor chip 330, a die attach film 340, and a first dummy chip 360.

The molding member 390 may cover the first semiconductor chip 310 and the second semiconductor chip 330, and an upper surface of the molding member 390 and an upper surface of the second semiconductor chip 330 may be disposed at the same vertical level. A lower surface of the second redistribution structure 200 disposed on the upper surface of the molding member 390 and the upper surface of the second semiconductor chip 330 may be disposed on the same plane.

The first dummy chip 360 may be stacked on the upper surface of the second semiconductor chip 330, and the die attach film 340 may be disposed between the upper surface of the second semiconductor chip 330 and a lower surface of the first dummy chip 360. A side surface of the first dummy chip 360 may not contact the molding member 390. The first dummy chip 360 may be apart from the second redistribution structure 200 in a first horizontal direction X.

A vertical distance h1 to the upper surface of the second semiconductor package 400 from the lower surface of the first redistribution structure 100 may be in a range of about 1.1 mm to about 1.2 mm, but is not limited thereto.

A height to an upper surface, which is the upper surface of the first semiconductor package 300-1, of the first dummy chip 360 from the lower surface of the first redistribution structure 100 may be less than h1. That is, the upper surface of the first dummy chip 360 may be lower than a vertical level of the upper surface of the second semiconductor package 400.

Figure 12:
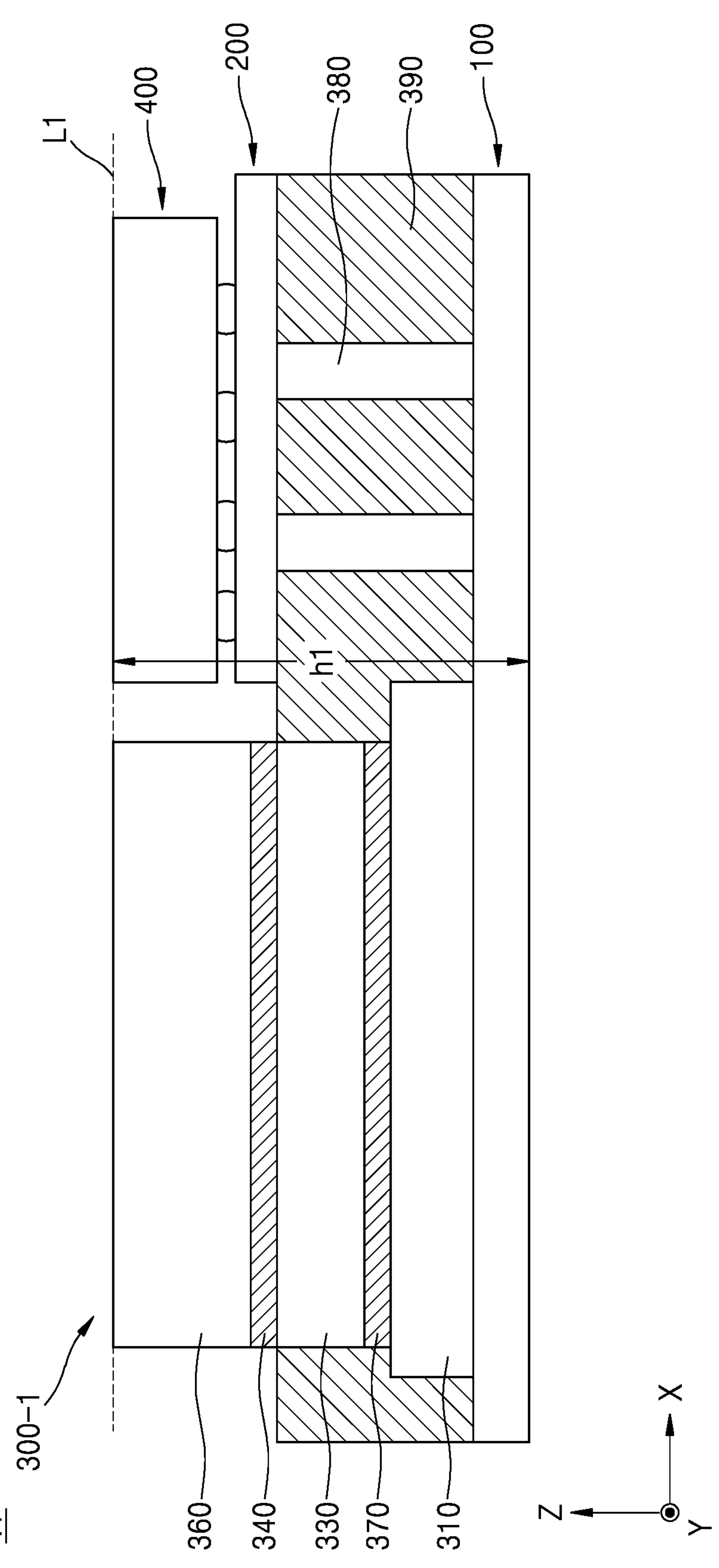
FIG. 12 is a cross-sectional view illustrating a semiconductor package according to an embodiment.

FIG. 12 is a cross-sectional view illustrating a semiconductor package 17 according to an embodiment. Hereinafter, repeated descriptions of the semiconductor package 17 of FIG. 11 and the semiconductor package 16 of FIG. 11 are omitted, and a difference therebetween will be mainly described.

Referring to FIG. 12, the semiconductor package 17 may include a first redistribution structure 100, a first semiconductor package 300-1, a second redistribution structure 200, and a second semiconductor package 400.

The upper surface of the first dummy chip 360 and the upper surface of the second semiconductor package 400 may be disposed at the same vertical level. The upper surface of the first dummy chip 360 and the upper surface of the second semiconductor package 400 may be disposed on the same plane.

A distance h1 up to an upper surface of the second semiconductor package 400 from a lower surface of the first redistribution structure 100 may be in a range of about 1.1 mm to about 1.2 mm and may be equal to a distance up to an upper surface of the first dummy chip 360 from the lower surface of the first redistribution structure 100. The upper surface of the first dummy chip 360 and the upper surface of the second semiconductor package 400 may be disposed at the same vertical level. In other words, a rectilinear line L1 contacting the upper surface of the first dummy chip 360 may contact the upper surface of the second semiconductor package 400.

Heat occurring in the semiconductor package 17 may be dissipated to the outside through the first dummy chip 360 of the first semiconductor package 300-1. Because the first dummy chip 360 is disposed at the same vertical level as the upper surface of the second semiconductor package 400, a vertical height of the semiconductor package 17 may be maintained, and an area where the first dummy chip 360 contacts the outside may enlarge. Accordingly, a thermal conductance of the semiconductor package 17 may increase, and thus, heat occurring in the semiconductor package 17 may be more efficiently dissipated to the outside.

Figure 13:
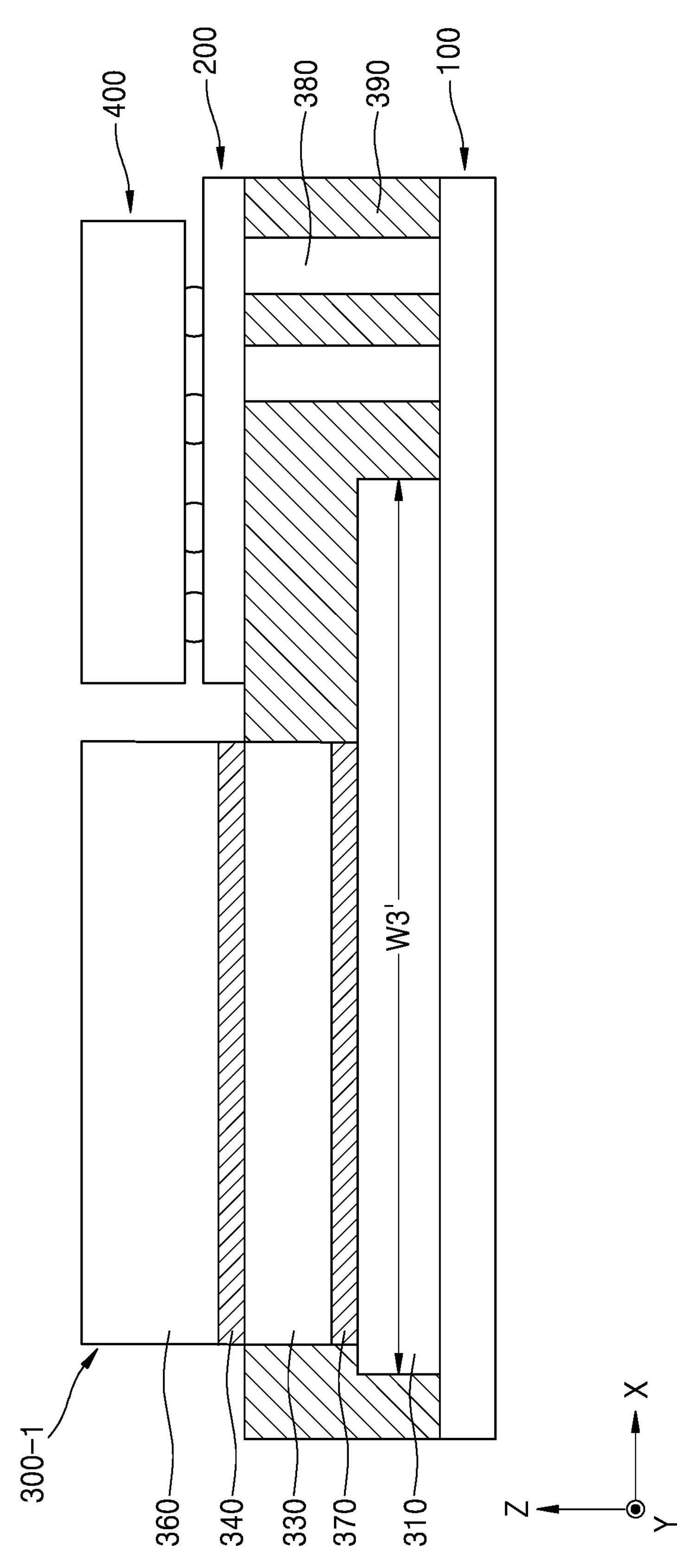
FIG. 13 is a cross-sectional view illustrating a semiconductor package according to an embodiment.

FIG. 13 is a cross-sectional view illustrating a semiconductor package 18 according to an embodiment. Hereinafter, repeated descriptions of the semiconductor package 18 of FIG. 13 and the semiconductor package 16 of FIG. 11 are omitted, and a difference therebetween will be mainly described.

Referring to FIG. 13, the semiconductor package 18 may include a first redistribution structure 100, a first semiconductor package 300-1, a second redistribution structure 200, and a second semiconductor package 400.

The first semiconductor package 300-1 may include a first semiconductor chip 310, an adhesive layer 370, a molding member 390, a conductive pillar 380, a second semiconductor chip 330, a die attach film 340, and a first dummy chip 360.

The first semiconductor chip 310 may extend in a first horizontal direction X, and a portion of the first semiconductor chip 310 may overlap the second redistribution structure 200 in a vertical direction. A horizontal-direction length W3' of the first semiconductor chip 310 may be greater than the horizontal-direction length W3 of the first semiconductor chip 310 of the semiconductor package 16 of FIG. 11. An area where an upper surface of the first semiconductor chip 310 contacts the molding member 390 may increase. A footprint of the first semiconductor chip 310 may be greater than that of the second semiconductor chip 330.

As the horizontal-direction length W3' of the first semiconductor chip 310 increases, conductive pillars 380 may be more densely disposed on one side surface of an upper surface of the first redistribution structure 100.

As a horizontal area of the first semiconductor chip 310 increases, a thermal conductance of the first semiconductor package 300-1 may increase. Accordingly, heat occurring in the semiconductor package 18 may be efficiently dissipated to the outside.

FIGS. 14 to 18 are schematic diagrams for describing a method of manufacturing a semiconductor package, according to an embodiment.

Figure 14:
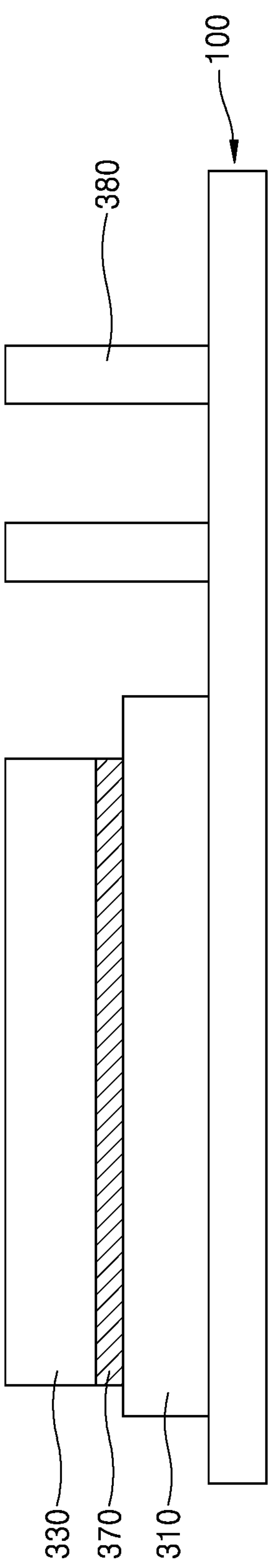
FIGS. 14 to 18 are schematic diagrams for describing a method of manufacturing a semiconductor package, according to an embodiment.

Referring to FIG. 14, a first semiconductor chip 310, an adhesive layer 370, and a second semiconductor chip 330 may be sequentially stacked on one side of an upper surface of a first redistribution structure 100, and a conductive pillar 380 may be formed on the other side of the first redistribution structure 100.

Figure 15:
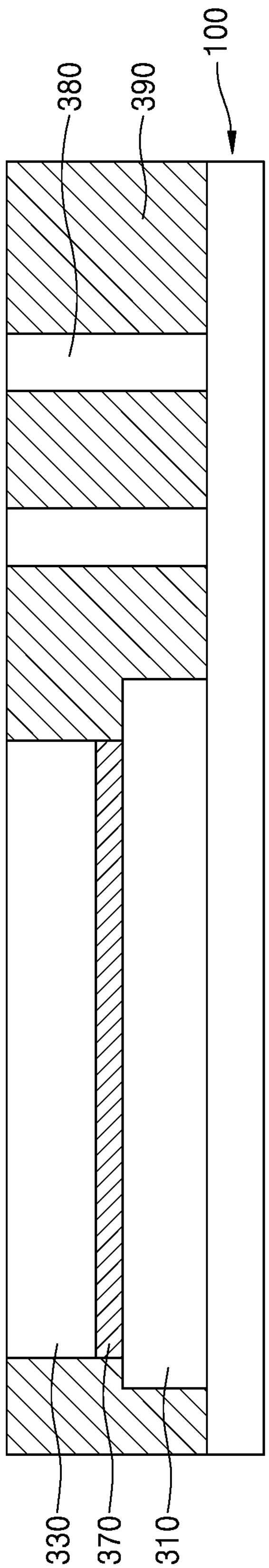

Subsequently, referring to FIG. 15, a molding member 390 surrounding the first semiconductor chip 310, the adhesive layer 370, the second semiconductor chip 330, and the conductive pillar 380 may be formed on the first redistribution structure 100. An upper surface of the molding member 390 may be formed on the same plane as an upper surface of the second semiconductor chip 330 and an upper surface of the conductive pillar 380.

Figure 16:
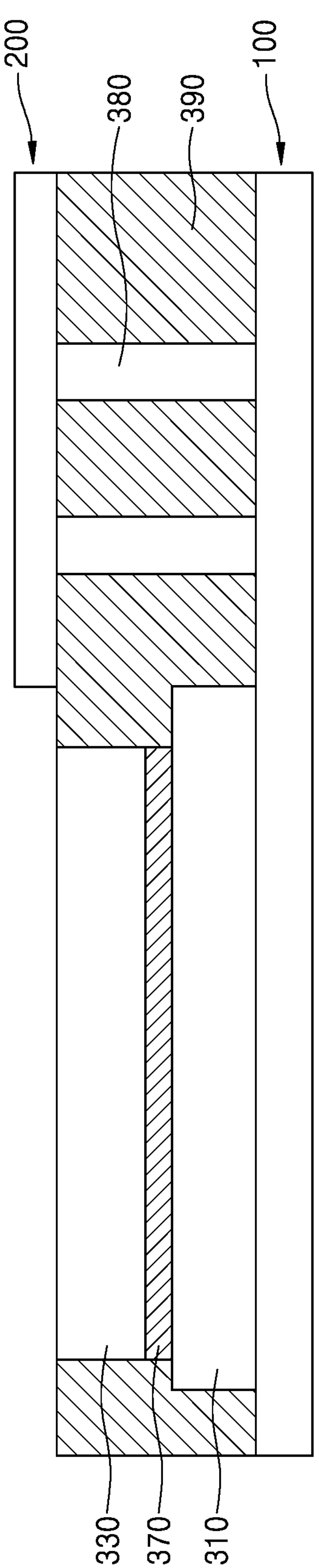

Referring to FIG. 16, a second redistribution structure 200 may be formed on one side surface of the upper surface of the molding member 390. The second redistribution structure 200 may be formed on the upper surface of the conductive pillar 380 so as to be electrically connected with the upper surface of the conductive pillar 380. The second redistribution structure 200 may be formed on one side surface of the molding member 390 so that the second redistribution structure 200 does not overlap the second semiconductor chip 330 in a vertical direction.

Figure 17:
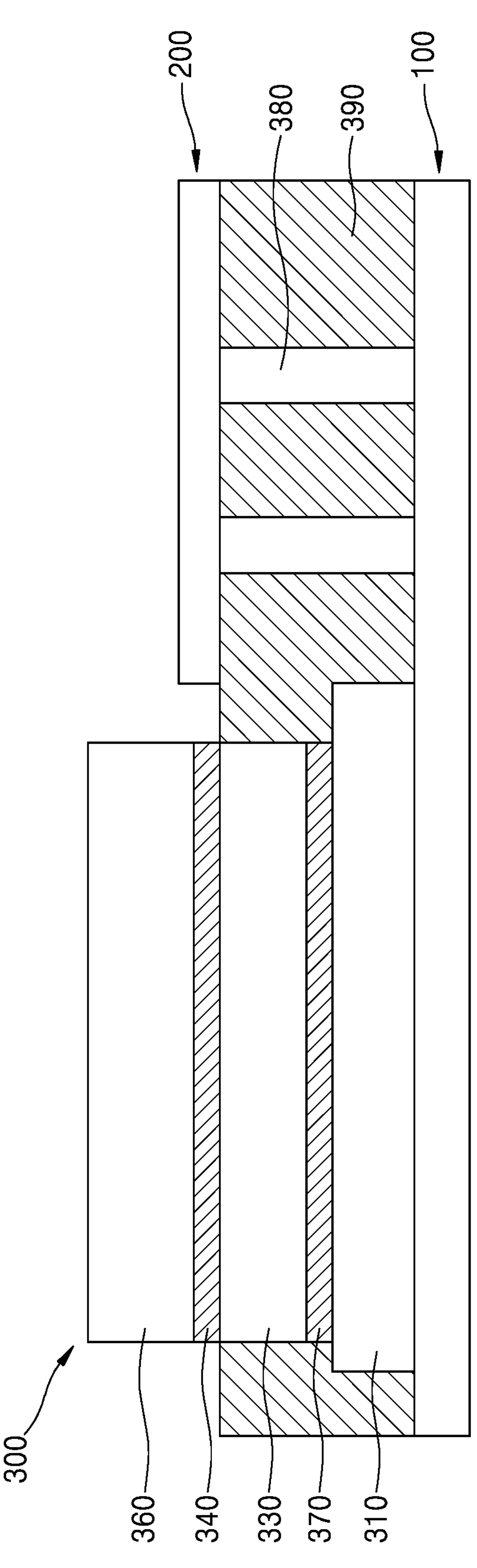

Referring to FIG. 17, a die attach film 340 and a first dummy chip 360 may be formed on the upper surface of the second semiconductor chip 330. The die attach film 340 may be attached on a lower surface of the first dummy chip 360, and the first dummy chip 360 on which the die attach film 340 is attached may be stacked on the second semiconductor chip 330. Therefore, the first semiconductor package 300 may be mounted on the first redistribution structure 100.

Figure 18:
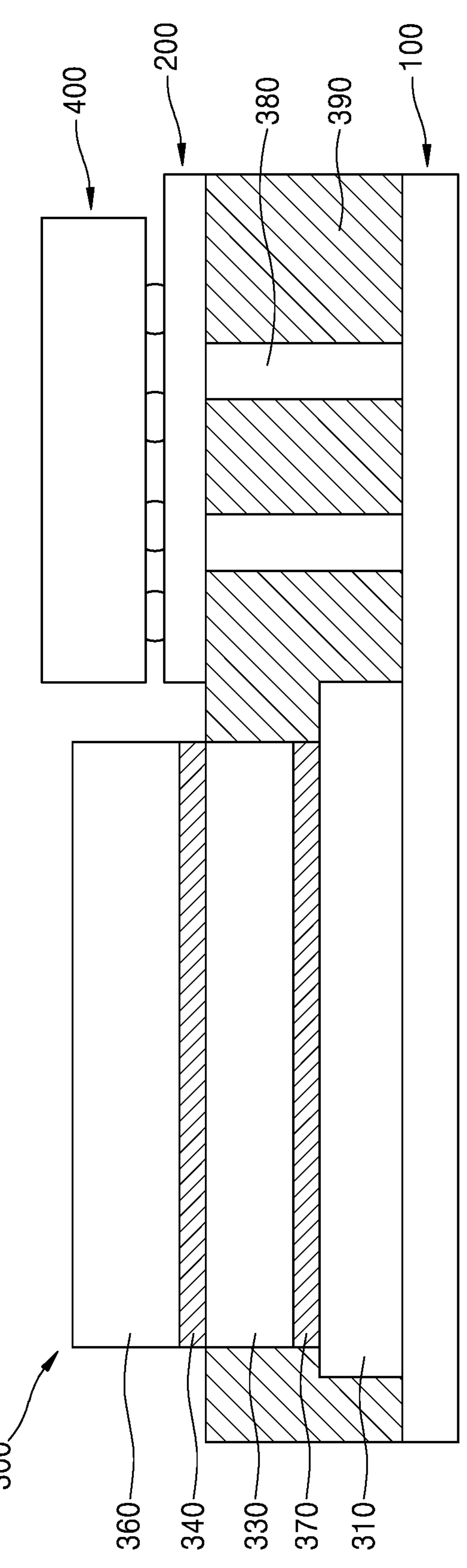

Referring to FIG. 18, the second semiconductor package 400 may be formed on the upper surface of the second redistribution structure 200, and a manufacturing process may end. Based on the processes, a semiconductor package according to the disclosure may be manufactured.

Hereinabove, example embodiments have been described in the drawings and the specification. Embodiments have been described by using the terms described herein, but this has been merely used for describing the disclosure and has not been used for limiting a meaning or limiting the scope of the disclosure defined in the following claims. Therefore, it may be understood by those of ordinary skill in the art that various modifications and other equivalent embodiments may be implemented from the disclosure. Accordingly, the spirit and scope of the disclosure may be defined based on the spirit and scope of the following claims.

While the disclosure has been particularly shown and described with reference to embodiments thereof, it will be understood that various changes in form and details may be made therein without departing from the spirit and scope of the following claims.

What is claimed is:

1. A semiconductor package comprising:

a first redistribution structure;

a first semiconductor package on the first redistribution structure, the first semiconductor package comprising:

a first semiconductor chip which comprises a first device layer and a first semiconductor substrate comprising a through electrode, a second semiconductor chip which is on the first semiconductor chip and comprises a second device layer and a second semiconductor substrate, and a molding member surrounding the first semiconductor chip;

a second redistribution structure on an upper surface of the molding member; and a second semiconductor package on the second redistribution structure, the second semiconductor package comprising a third semiconductor chip; and an adhesive layer between the first semiconductor chip and the second semiconductor chip to attach the second semiconductor chip on the first semiconductor chip, wherein the second semiconductor chip is apart from the second semiconductor package in a horizontal direction, wherein an upper surface of the second semiconductor chip is higher than the upper surface of the molding member, wherein the upper surface of the molding member is higher than an upper surface of the first semiconductor chip, and wherein the upper surface of the molding member and an upper surface of the adhesive layer are on a same plane.

2. The semiconductor package of claim 1, wherein the upper surface of the second semiconductor chip and an upper surface of the second semiconductor package are at a same vertical level.

3. The semiconductor package of claim 1, wherein the first semiconductor package further comprises a first dummy chip on the upper surface of the second semiconductor chip.

4. The semiconductor package of claim 3, wherein an upper surface of the first dummy chip and the upper surface of the second semiconductor package are at a same vertical level.

5. The semiconductor package of claim 4, wherein the first semiconductor package further comprises a die attach film between the second semiconductor chip and the first dummy chip to attach the first dummy chip on the second semiconductor chip.

6. The semiconductor package of claim 1, wherein a horizontal length of the first redistribution structure is greater than a horizontal length of the second redistribution structure.

7. The semiconductor package of claim 6, wherein a portion of the first semiconductor chip overlaps the second redistribution structure in a vertical direction.

8. The semiconductor package of claim 7, further comprising a conductive pillar apart from the first semiconductor package in the horizontal direction to pass through the molding member in the vertical direction and electrically connect the first redistribution structure with the second redistribution structure.

9. The semiconductor package of claim 1, wherein the first device layer of the first semiconductor chip is under the first semiconductor substrate, and wherein the through electrode has a tapered shape such that a horizontal width of the through electrode decreases progressively as a vertical level increases.

10. The semiconductor package of claim 1, wherein the first device layer of the first semiconductor chip is on the first semiconductor substrate, and wherein the through electrode has a tapered shape such that a horizontal width of the through electrode decreases progressively as a vertical level decreases.

11. The semiconductor package of claim 1, wherein the second device layer is under the second semiconductor substrate.

12. A semiconductor package comprising:

a first redistribution structure;

a first semiconductor package comprising:

a first semiconductor chip which is on the first redistribution structure and comprises a first semiconductor substrate, a through electrode passing through the first semiconductor substrate, and a first device layer on the first semiconductor substrate, a second semiconductor chip which is on the first semiconductor chip and comprises a second semiconductor substrate and a second device layer on the second semiconductor substrate, and a molding member surrounding the first semiconductor chip and the second semiconductor chip;

a first dummy chip on an upper surface of the second semiconductor chip;

a second redistribution structure on an upper surface of the molding member and apart from the first dummy chip in a horizontal direction; and a second semiconductor package on the second redistribution structure, the second semiconductor package comprising a third semiconductor chip, wherein the first dummy chip is apart from the second semiconductor package in the horizontal direction, wherein an upper surface of the first dummy chip is higher than the upper surface of the molding member, and wherein the upper surface of the molding member is higher than an upper surface of the first semiconductor chip.

13. The semiconductor package of claim 12, wherein the third semiconductor chip comprises a semiconductor memory chip.

14. The semiconductor package of claim 12, wherein the upper surface of the first dummy chip and an upper surface of the second semiconductor package are at a same vertical level.

15. The semiconductor package of claim 12, wherein the upper surface of the second semiconductor chip is on a same plane as the upper surface of the molding member.

16. The semiconductor package of claim 12, wherein a portion of the first semiconductor chip overlaps the second redistribution structure in a vertical direction.

17. The semiconductor package of claim 12, wherein the second semiconductor package comprises a second dummy chip on the third semiconductor chip, and wherein an upper surface of the second dummy chip is at a same vertical level as the upper surface of the first dummy chip.

18. A semiconductor package comprising:

a first redistribution structure comprising a first insulation layer and a first redistribution pattern in the first insulation layer;

a first semiconductor package comprising:

a first semiconductor chip which is on the first redistribution structure and comprises a first device layer and a first semiconductor substrate comprising a through electrode, a second semiconductor chip which is on the first semiconductor chip and comprises a second semiconductor substrate and a second device layer, an adhesive layer between the first semiconductor chip and the second semiconductor chip, a molding member surrounding the first semiconductor chip and at least a portion of the second semiconductor chip, and a conductive pillar passing through the molding member;

a first dummy chip on an upper surface of the second semiconductor chip;

a die attach film between the second semiconductor chip and the first dummy chip to attach the first dummy chip on the second semiconductor chip;

a second redistribution structure on an upper surface of the molding member and apart from the first dummy chip in a horizontal direction; and a second semiconductor package on the second redistribution structure, the second semiconductor package comprising a third semiconductor chip, wherein the second device layer is on the second semiconductor substrate, wherein the first dummy chip is apart from the second semiconductor package in the horizontal direction, wherein a vertical distance to an upper surface of the first dummy chip from a lower surface of the first redistribution structure is in a range of 1 mm to 1.3 mm, wherein the upper surface of the first dummy chip and an upper surface of the second semiconductor package are on the same plane, and wherein an upper surface of the molding member is higher than an upper surface of the first semiconductor chip.

* * * * *